(12) United States Patent
Galton

(10) Patent No.: US 6,734,818 B2
(45) Date of Patent: May 11, 2004

(54) DIGITAL CANCELLATION OF D/A CONVERTER NOISE IN PIPELINED A/D CONVERTERS

(75) Inventor: Ian Galton, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/792,751

(22) Filed: Feb. 22, 2001

(65) Prior Publication Data

US 2002/0041248 A1 Apr. 11, 2002

Related U.S. Application Data

(60) Provisional application No. 60/184,205, filed on Feb. 22, 2000.

(51) Int. Cl.[7] .............................. H03M 1/06; H03M 1/38
(52) U.S. Cl. ......................................... 341/161; 341/118
(58) Field of Search ................................. 341/118, 120, 341/161, 162, 143, 150, 155; 323/315, 316

(56) References Cited

U.S. PATENT DOCUMENTS

| | | | |
|---|---|---|---|
| 5,248,973 A | | 9/1993 | Babu et al. |
| 5,406,283 A | | 4/1995 | Leung |
| 5,436,629 A | | 7/1995 | Mangelsdorf |
| 5,892,472 A | * | 4/1999 | Shu et al. ..................... 341/139 |
| 5,949,361 A | * | 9/1999 | Fischer et al. ............... 341/143 |
| 6,137,431 A | * | 10/2000 | Lee et al. ..................... 341/161 |
| 6,211,805 B1 | * | 4/2001 | Yu ............................... 341/155 |
| 6,266,002 B1 | * | 7/2001 | Gong et al. .................. 341/150 |
| 6,456,223 B1 | * | 9/2002 | Yu et al. ....................... 341/161 |
| 6,515,611 B1 | * | 2/2003 | Fetterman et al. ........... 341/161 |

* cited by examiner

*Primary Examiner*—Patrick Wamsley
(74) *Attorney, Agent, or Firm*—Fish & Richardson P.C.

(57) ABSTRACT

An improvement to a conventional multistage pipelined Analog-to-Digital Converter (ADC) 1, the improvement directed to canceling noise resultant from component mismatch. The improved ADC 2 uses in at least a first, and preferably two, stages 21, 22: (i) a flash DAC 212, 222 of a dynamic element matching (DEM) type producing, as well as an associated intermediate analog signal, random bits and parity bits; (ii) a Digital Noise Cancellation (DNC) logic circuit 217, 227, receiving the random bits and the parity bits and a digitized residue sum of the digital output signals arising from all stages beyond a stage of which the DNC logic circuit 217, 227 is a part, so as to produce an error estimate for the stage; and (iii) a subtractor 218, 228 subtracting the error estimates of the DNC logic circuits 217, 227 from the combined digital output signal of all higher stages 22–24 in order to produce a corrected ADC digital output signal.

7 Claims, 15 Drawing Sheets

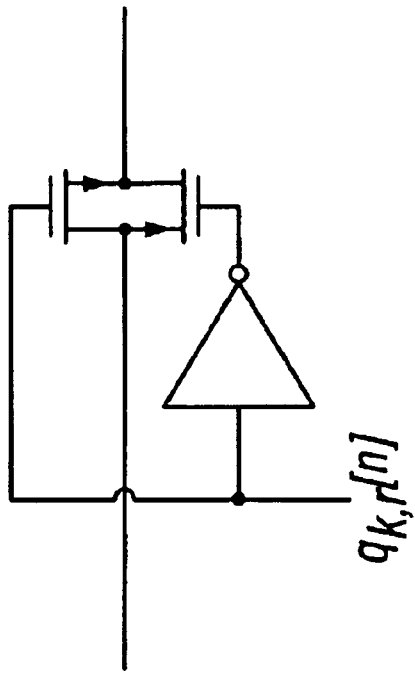
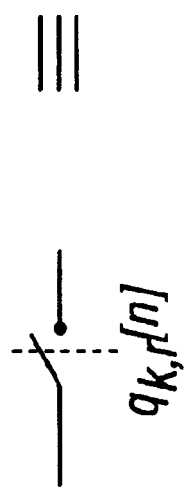
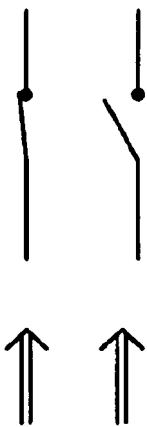
FIG. 6A
FIG. 6B
FIG. 6C
$q_{k,r}[n]$ = High
$q_{k,r}[n]$ = Low

DIGITAL CANCELLATION OF D/A CONVERTER NOISE IN PIPELINED A/D CONVERTERS

RELATION TO A PROVISIONAL PATENT APPLICATION

The present patent application is descended from, and claims benefit of priority of, U.S. provisional patent application Serial No. 60/184,205 filed on Feb. 22, 2000 for DIGITAL NOISE CANCELLATION IN PIPELINED ANALOG TO DIGITAL CONVERTERS to the selfsame inventor as is the present patent application.

BACKGROUND OF THE INVENTION

1. Field of the Invention

The present invention generally concerns pipelined analog to digital (A/D) conversion in which is performed noisy digital to analog (D/A) conversion, and pipelined analog to digital (A/D) converters internally incorporating noisy digital to analog (D/A) converters.

The present invention particularly concerns noise, and more particularly noise due to component mismatch, occurring in A/D conversion and in A/D converters—particularly as are used in D/A conversion and converters—and the abatement and/or cancellation of this noise.

2. Description of the Prior Art
2.1 General Background

It is known that digital-to-analog converters (DACs) and analog-to-digital converters (ADCs) have systemic sources of noise, and that these noise sources can sometimes be abated, or canceled.

For example, U.S. Pat. No. 5,684,482 for SPECTRAL SHAPING OF CIRCUIT ERRORS IN DIGITAL-TO-ANALOG CONVERTERS to the selfsame inventor Galton as is the present invention concerns a general digital-to-analog (DAC) topology that spectrally shapes the DAC conversion noise caused by analog circuit mismatches. In particular, certain highly practical first-order and second-order noise-shaping DACs that are special cases of a general topology are taught. The topology extends the practicality of using noise-shaping DACs in $\Delta\Sigma$ data converters. A first-order DAC shown in the patent is at least as hardware efficient as previously known DACs, but offers the advantage that it is amenable to a simple dithering technique capable of eliminating spurious tones. A second-order DAC shown in the patent is more hardware efficient than previously known DACs, and generally has a large spurious-free dynamic range without any dithering. DACs with other types of noise-shaping characteristics (e.g., bandpass noise-shaping characteristics) may be designed based on general DAC topology.

2.2 Specific Background

Unlike other types of noise in a conventional pipelined analog to digital converter (ADC), noise introduced by a first-stage digital to analog converter (DAC) that is within the ADC is not attenuated or canceled along the pipeline, so it tends to be the dominant contributor of overall ADC error. See S. H. Lewis and P. R. Gray, "A pipelined 5-Msample/s 9-bit analog-to-digital converter," IEEE Journal of Solid State Circuits, vol. SC-22, no. 6, pp. 954–961, Dec. 1987. See also S. Sutarja and P. R. Gray, "A pipelined 13-bit 250-ks/s 5-V analog-to-digital converter," IEEE Journal of Solid State Circuits, vol. 23, no. 6, pp. 1316–1323, Dec. 1988.

In typical switched-capacitor implementations, most of this DAC noise arises from static capacitor mismatches. With present VLSI circuit technology it is difficult to match capacitors to better than 0.1%. This translates into an A/D conversion limit of about 11 bits in pipelined ADC architectures not having some form of error cancellation.

SUMMARY OF THE INVENTION

Pipelined analog-to-digital converters (ADCs) tend to be sensitive to component mismatches in their internal digital-to-analog converters (DACs). These component mismatches give rise to error, referred to as DAC noise, which is not attenuated or canceled along the ADC pipeline as are other types of noise. The present invention contemplates an all-digital technique that significantly mitigates this problem.

In particular, the present invention concerns a technique for digital cancellation of DAC noise arising from static analog errors such as capacitor mismatches. The technique is referred to as DAC noise cancellation (DNC). It differs from most other cancellation schemes in that it measures and cancels the DAC noise continuously during normal operation of the ADC; no special calibration signal nor auto calibration phase is required prior to A/D conversion.

In the presence of realistic component matching limitations, the technique of the present invention improves the overall ADC accuracy by several bits with only moderate digital hardware complexity. Both the measurement and cancellation of DAC noise are entirely performed using digital logic, so no additional analog circuits are required over those of a conventional pipelined ADC. The digital complexity of the DNC processing is well within practical limits for typical CMOS and BiCMOS circuit technologies.

1. Error Correction—Particularly Digital Cancellation of D/A Converter Noise—in Pipelined A/D Converters In one of its aspects the present invention in embodied in an improvement to a multistage pipelined Analog-to-Digital Converter (ADC). The improvement is directed to error correction, and more particularly to digital cancellation of noise—most particularly as results from mismatch between components—principally arising in Digital-to-Analog Converters (DACs) that are within each stage of the multistage ADC.

The improvement is thus to a conventional multistage pipelined Analog-to-Digital Converter (ADC)—receiving an analog input signal—that has a plurality of stages each connected one to the next by an interstage amplifier. Each stage has a flash digital-to-analog converter (DAC)—a DAC of the first stage receiving the analog input signal while DACs of subsequent stages receive analog signals each from a respective interstage amplifier—producing a multi-level digital signal. A digital-to-analog converter (DAC) in each stage converts an associated produced multi-level digital signal to an associated intermediate analog signal. Each intermediate analog signal is feed both to (i) a subtractor of the intermediate analog signal from the associated analog signal received by the stage to produce an analog difference signal that is fed to the interstage amplifier of a next following stage, and also to (ii) a thermometer encoder producing an associated digital output signal. The digital output signals of all the plurality of stages are summed to produce an overall ADC digital output signal. This construction, and this co-action between components, is conventional.

The present invention constitutes an improvement where a flash digital-to-analog converter (DAC) (which is of a dynamic element matching (DEM) type) within each stage is enhanced so as to produce, as well as an associated intermediate analog signal, a (i) plurality of random bits and a (ii) plurality of parity bits. To this enhanced DAC is added within each stage a new (i) Digital Noise Cancellation (DNC) logic circuit, and (ii) a subtractor.

The DNC logic circuit of each stage receives (1) the (i) plurality of random bits and the (ii) plurality of parity bits from the associated DEM-type DAC and (2) a digitized residue sum of the digital output signals of all stages beyond a stage of which the DNC logic circuit is a part, in order to produce an error estimate for the stage.

The subtractor of each stage subtracts the error estimate received from the DNC logic circuit of the stage from, in succession stage by stage, the ADC digital output signal so as to produce, ultimately, a ADC digital output signal that is corrected for noise arising in, inter alia, the DAC of each stage.

The Digital Noise Cancellation (DNC) logic circuit for each stage preferably includes (1) an adder of the plurality of random bits and the digitized residue to produce an intermediary result; (2) a three-level requantizer of the intermediary result producing a three-level signal; (3) a plurality of channels, receiving the three-level signal, and (4) an adder summing outputs of all the channels to produce the error estimate for the stage.

Each (3) channel preferably includes (3a) a first multiplier multiplying the three-level signal and an associated one of the random bits, (3b) a second multiplier multiplying an output from the first multiplier and an associated one of the random bits, (3c) an averager of a predetermined number of outputs from the second multiplier producing a true average, (3d) a third multiplier multiplying the true average and the associated one of the random bits, and (3e) a fourth multiplier multiplying an output from the third multiplier and the associated one of the random bits. The (4) adder thus sums the outputs of the fourth multipliers of all the channels to produce the error estimate for the stage.

The DEM-type DAC preferably includes a digital encoder dividing an N-level digital input signal into multiple digital output signals. Each such digital encoder preferably includes (1) two or more switching blocks each having a digital input signal and two digital output signals where a sum of the two digital output signals equals the digital input signal; and (2) a converter converting a sum of the multiple digital output signals as arise from all the digital encoder into a nominally equivalent analog signal.

2. Improvement to a Multi-stage Pipelined A/D Converter

The embodiment of the present invention as an improvement to a multistage pipelined Analog-to-Digital Converter may be still more succinctly expressed if the entire ADC, and the improvement thereto, are reduced to their core essence.

In a multistage analog-to-digital converter (ADC) having in each stage (i) a flash digital-to-analog converter (DAC) producing a digital signal, and (ii) a thermometer encoder producing from the DAC digital signal another digital signal summable with the like signals of the encoders of other stages to produce, ultimately, an ADC digital output signal, the improvement of the present invention reduces, in essence, to just three elements:

First, an enhancement to the flash DAC of each stage serves to cause the DAC to produce, as well as the DAC digital signal, both random bits and parity bits.

Second, a Digital Noise Cancellation (DNC) logic circuit at each stage receives (1) these random bits and parity bits from the stage's enhanced DAC, and also (2) the digital signal from the stages's thermometer encoder, to produce a stage error signal.

Finally, a subtractor receives the stage error signal from the DNC logic circuit of the stage so as to error correct the ADC digital output signal and transmit it to a next stage. A succession of subtractors in all stages operate on the ADC digital output signal so as to make that, ultimately, this signal becomes corrected for, inter alia, signal error (i.e., noise) rising from, inter alia, component mismatch in the flash DACs.

3. A Method of Correcting in a Digital Output Signal of a Multistage Analog-to-Digital Converter (ADC) Error (Noise) Resultant From, Inter Alia, Component Mismatch in Flash Digital-to-Analog Converters (DACs) That are Within Each Stage of the Multistage ADC In yet another of its aspects the present invention is embodied in a method of correcting in a digital output signal of a multistage analog-to-digital converter (ADC) error (i.e., noise) resultant from, inter alia, component mismatch in flash digital-to-analog converters (DACs) that are within each stage of the multistage ADC.

The signal error correction method includes (1) producing in an enhanced flash DAC of each stage both (i) random bits and (ii) parity bits as well as a (iii) DAC digital signal; (2) producing in a Digital Noise Cancellation (DNC) logic circuit of each stage from the (i) random bits and (ii) parity bits of the stage's enhanced DAC, plus (iv) a digital signal from a thermometer encoder of the stage that has previously encoded an ADC digital signal of the stage, a stage error signal; and (3) subtracting in a subtractor of each stage the stage's error signal produced in the DNC logic circuit from an ADC digital output signal of the entire ADC, passing onward to a next successive stage the corrected ADC digital output signal until, at the conclusion of all stages the ADC digital output signal is corrected for, inter alia, error in this signal rising from component mismatch in the flash DACs.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 6, consisting of FIGS. 6a through 6c, are diagrams of the implementation with transfer gates, and the operation, of swapper cell switches used in the pipelined ADC of the present invention (a switch with the opposite polarity is obtained by interchanging the n-channel and p-channel transistors).

DESCRIPTION OF THE PREFERRED EMBODIMENT

The following description is of the best mode presently contemplated for the carrying out of the invention. This description is made for the purpose of illustrating the general principles of the invention, and is not to be taken in a limiting sense. The scope of the invention is best determined by reference to the appended claims.

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. Digital Noise Cancellation (DNC)

In this specification each of the (i) DNC architecture, (ii) operational results, and (iii) theory or operation are presented in the context of a specific pipelined ADC architecture example. A conventional version of a pipelined ADC architecture (i.e., without the DNC of the present invention) is described in Section 2, and the modifications to this architecture required to apply the DNC technique of the present invention are described in detail in Section 3.

An overview of the signal processing theory behind the DNC technique of the present invention is presented in Section 4. The convergence rate of the DNC measurement process as obtained by computer simulation is presented in Section 5.

2. An Exemplary Conventional Pipelined ADC

Figure 1:
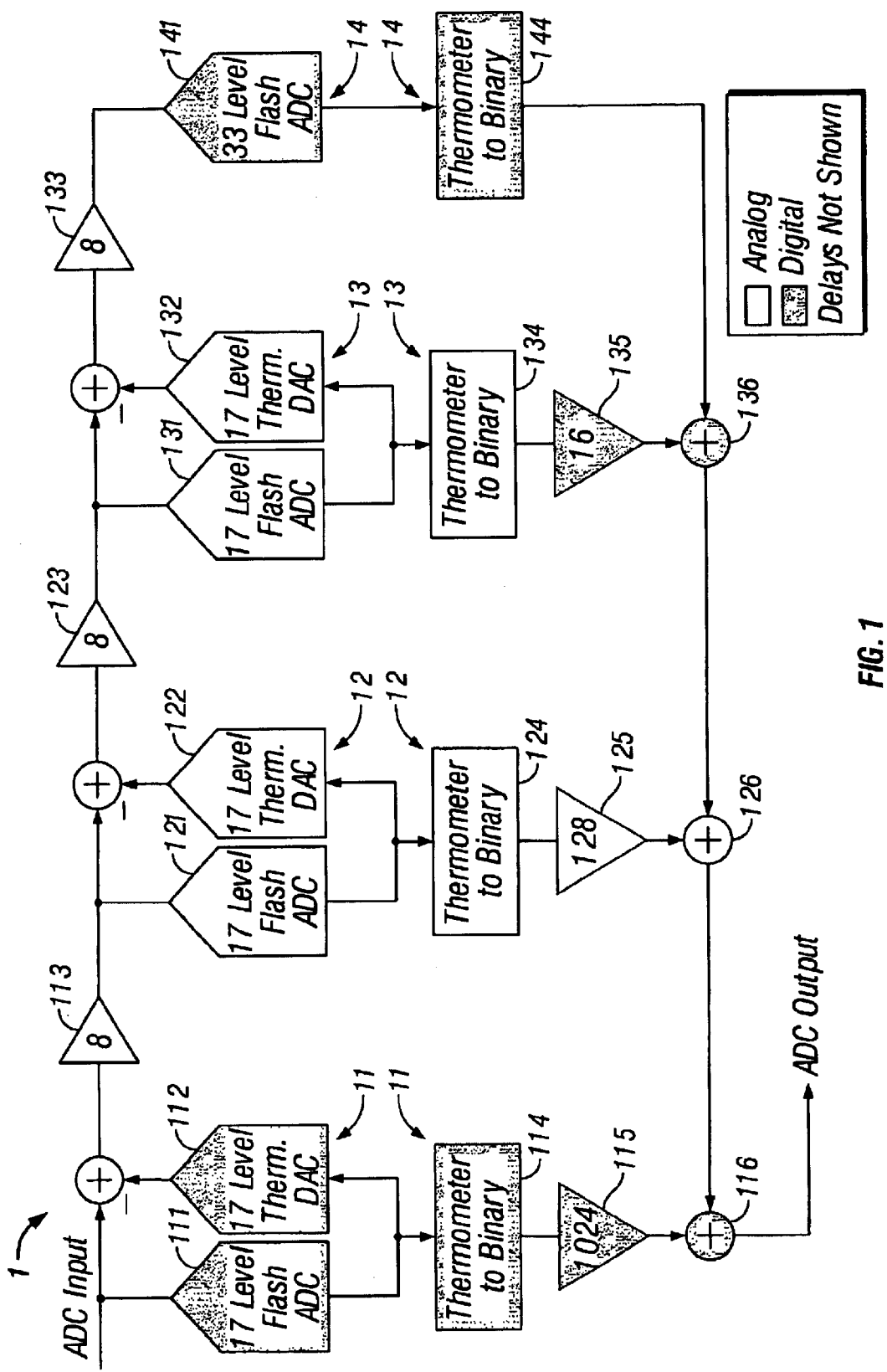
FIG. 1 is a functional diagram of an exemplary prior art 14-bit four-stage pipelined ADC.

An exemplary conventional, prior art, pipelined ADC 1 is shown in FIG. 2. The ADC consists of four pipeline stages 11–14. Portion of the ADC 1 are analog, and portions are digital, as indicated by the legend of FIG. 1. The first three stages 11–13 each incorporate a 17-level flash ADC 111, 121, 131 and a 17-level switched-capacitor DAC 112, 122, 132. The fourth stage 14 consists of a 33-level flash ADC 141. The three 17-level ADCs 111, 121, 131 are nominally identical; each consists of 16 voltage comparators (not shown in FIG. 1) that compare the voltage at the input of the ADC 1 to a set of 16 reference voltages nominally ranging from to −0.75 V to +0.75 V in steps of 100 mV. The corresponding ADC 1 input no-overload range, i.e., the range of input values for which the quantization error never exceeds half of the step-size, is −0.85 V to +0.85 V. The 33-level flash ADC 141 is similar except that it consists of 32 comparators (not shown in FIG. 1) and its 32 reference voltages nominally range from to −0.775 V to +0.775 V in steps of 50 mV. The corresponding input no-overload range is to −0.825 V to +0.825 V.

The output of each 17-level ADC 111, 121, 131 is the set of its 16 one-bit comparator outputs, and that of the 33-level ADC 141 is the set of its 32 one-bit comparator outputs. This type of digital encoding is referred to as thermometer encoding, and the digital value of each ADC output is interpreted as the number of its comparator outputs that are high.

The three 17-level DACs 112, 122, 132 are each implemented using 16 switched-capacitor one-bit DACs that share a common summing node. In each case, the 16 one-bit DACs are driven directly by the 16 comparator outputs from the corresponding 17-level ADC 112, 122, 132. The nominal output voltage levels associated with each one-bit DAC are ±50 mV. Therefore, the output of each 17-level DAC 112, 122, 132 is nominally within 50 mV of the input to the corresponding ADC 111, 121, 131 provided the no-overload range of the ADC 111, 121, 131 is not exceeded.

In each stage except for the last, the difference between the ADC input and DAC output is amplified by an interstage gain of 8 in amplifiers 113, 123, 133. In the absence of ADC and DAC errors, the interstage gains are such that just under half of the no-overload ranges of the ADCs 121, 131, 141 in the second through last stages are ultimately used. That is, if a signal were applied to the input of the pipelined ADC 1 that varied over the full-scale input range of to −0.85 V to +0.85 V, then the resulting signals at the inputs to the ADCs 121, 131, 141 in the second through last stages would be restricted to the range: to −0.4 V to +0.4 V.

Therefore, the choice of 8 for the interstage gains in the amplifiers 113, 123, 133 ensures slightly more than a 100% margin for signals to over-range (i.e., exceed their ideal ranges) as a result of non-ideal analog circuit behavior without overloading the ADCs 121, 131, 141.

Prior to arithmetic processing, the output of each ADC 111, 121, 131, 141 is converted from thermometer encoded data to two's-complement binary encoded data in Thermometer to Binary converters 114, 124, 134, 144. After the conversion, the digital signals from the ADCs 111, 121, 131, 141 are scaled in scalers 115, 125, 135 and added in adders 116, 126, 136 as shown in FIG. 1. It can be verified that, in the absence of non-ideal circuit behavior, the pipelined ADC 1 of FIG. 1 performs uniform quantization with slightly more than 14 bits of precision. For example, if the input to the pipelined ADC 1 increases from to 0.8 V to +0.8 V (this range is slightly less than the full input no-overload range of the pipelined ADC 1 which is equal to that of the first 17-level ADC: −0.85 V to +0.85 V), the output increases from to −8192 to +8192. Consequently, the least significant bit (LSB) of the pipelined ADC 1 output corresponds to an input value of $1.6 \times 2^{14}$ V.

In practice, every analog component in the pipelined ADC 1 will exhibit non-ideal circuit behavior that will tend to degrade the overall conversion performance to less than 14 bits. However, the sensitivity of the pipelined ADC 1 to non-ideal circuit behavior of a given component is a function of where the component resides in the pipeline. It follows from FIG. 1 that in the first stage 11 the gain between either input node of the analog differencer and the overall pipelined ADC output is 10240. (With the LSB of each flash ADC 111, 121, 131, 141 interpreted as unity, the gain of the ADC is the inverse of its quantization step-size. Thus, the gain of each 17-level ADC 111, 121, 131 is 10 and that of the 33-level ADC 141 is 20.) However, the corresponding gains in the subsequent two stages 12, 13 are 1280, and 160, respectively, and the gain from the input to output of the last stage 14 is 20. Hence, the pipelined ADC 1 performance tends to be most sensitive to non-ideal circuit behavior in the first stage 11 and the sensitivity decreases by a factor of 8 (18 dB) in each subsequent stage 12–14. Furthermore, the pipelined ADC is virtually insensitive to error introduced by each of the 17-level ADCs 111, 121, 131 provided the error is not so large that the over-range margin of the next stage is exceeded. The reason is that in each case, the signal from the ADC 111, 121, 131 is converted back to analog, sign inverted, re-digitized by the subsequent stages of the pipeline, and added to the signal directly from the ADC 111, 121, 131, thereby canceling the error.

Figure 2A:
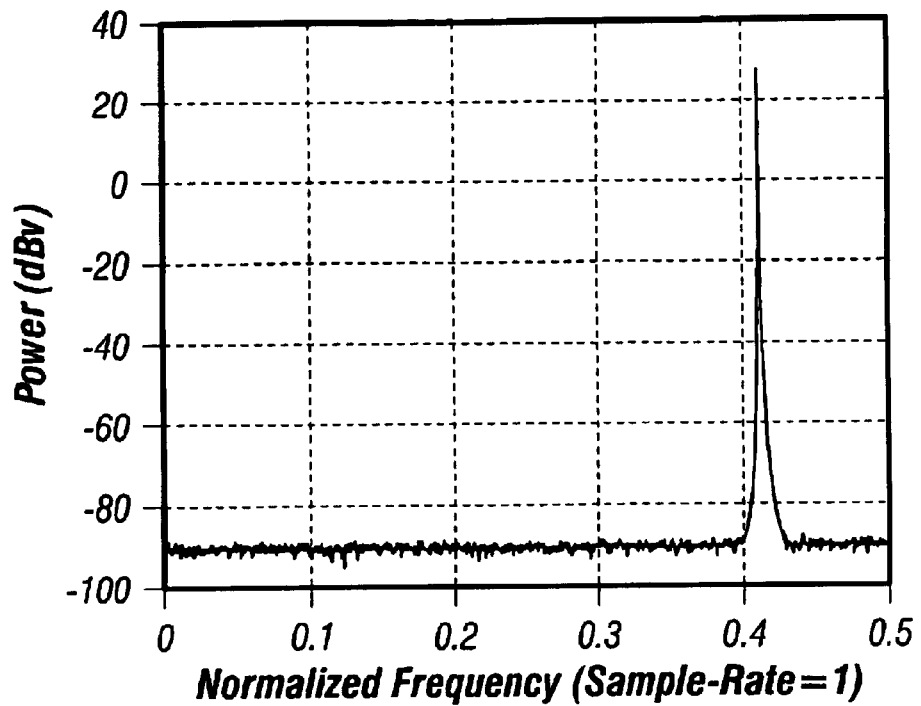
FIG. 2, consisting of FIGS. 2a through 2c, are plots of the power spectral density of the output of a pipelined ADC respectively implemented with a) ideal components, b) non-ideal components, and c) non-ideal components but with an ideal post-ADC removal of the error components arising from the DAC noise introduced in the first two stages of the pipeline.

To illustrate these concepts, three sets of simulation results are shown in graphical form in FIG. 2. FIG. 2a shows the power spectral density (PSD) of the output sequence from the pipelined ADC 1 of FIG. 1 implemented with ideal components. The ADC 1 output was normalized to have unity gain prior to estimating the PSD which is shown in units of dBV. The input signal was a nearly full-scale sinusoid plus a white dither sequence uniformly distributed over the nominal LSB of the pipelined ADC 1 (i.e., $1.6 \times 2^{-14}$ V). The purpose of the dither y was to allow precise calculation of the overall ADC 1 quantization noise power. As would be expected from an ideal uniform quantizer, only the desired signal plus white noise is evident in the PSD (the dither has been subtracted from the PSD in the FIG. 2a so the white noise corresponds entirely to quantization noise). The noise floor is −91 dBV and this corresponds to 14.1 bits of precision, as expected.

Figure 2B:
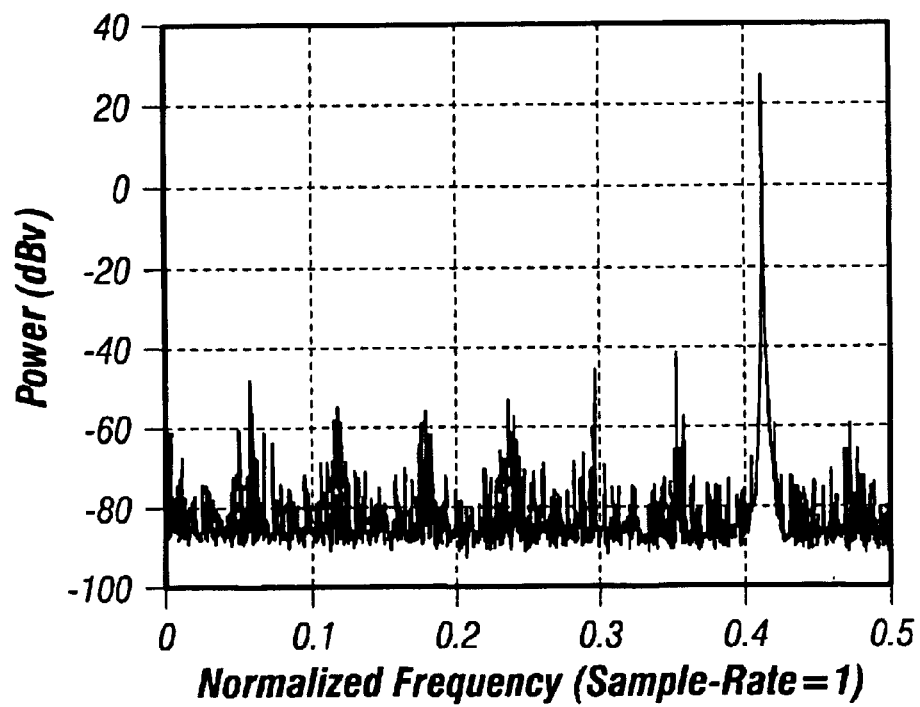

The PSD shown in FIG. 2b corresponds to the same input signal and pipelined ADC 1 architecture except that various realistic levels of non-ideal circuit behavior were included. Mismatches in the 17-level DACs 112, 122, 132 (shown in FIG. 1) were modeled by selecting the two output voltages corresponding to each one-bit DAC with random errors of 0.3% standard deviation. The reference voltages for each ADC 112, 122, 132 were generated by a simulated resistor ladder wherein each resistor was chosen with a random error of 0.3% standard deviation, and the offset voltage of each comparator in the ADC 112, 122, 132 was chosen randomly with a standard deviation of 10 mV. The interstage gains were chosen with a random error of 0.3% standard deviation. In all cases, the errors were chosen with a Gaussian distribution. As is evident from the numerous spurious tones and increased noise floor, these relatively small circuit non-idealities give rise to a dramatic reduction in performance. Integrating the PSD in the absence of the signal now indicates a precision equivalent to 10.4 bits, a reduction of 3.7 bits below the ideal performance level.

Figure 2C:
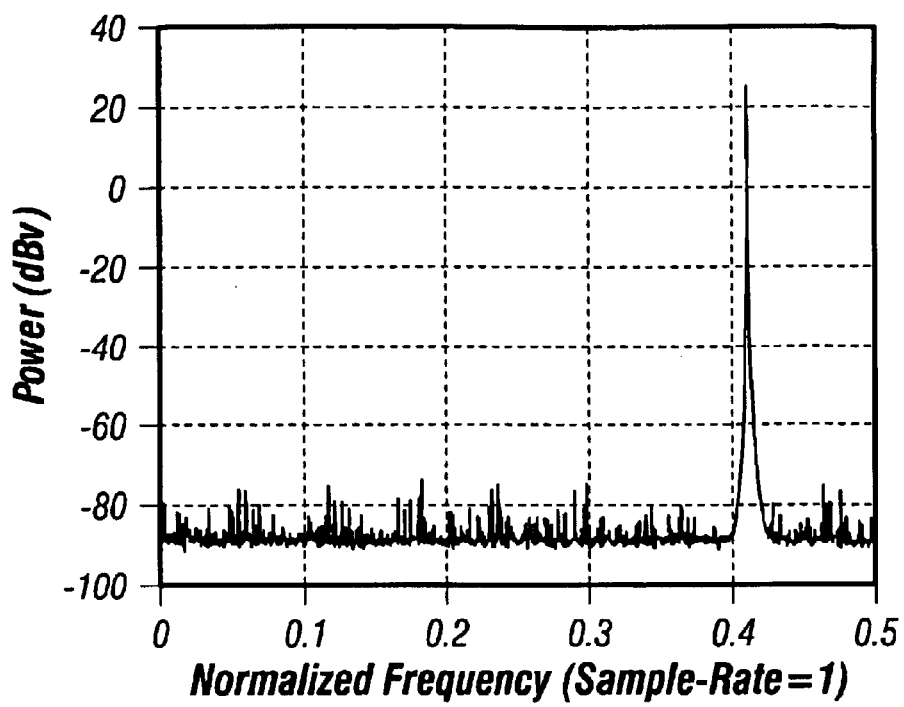

The PSD shown in FIG. 2c was obtained by performing the same simulation that resulted in FIG. 2b except subtracting from the output of the pipelined ADC 1 the error arising from DAC noise introduced by the 17-level DACs 112, 122 in the first two stages 11, 12 (shown in FIG. 1). A reduction in the power of the spurious tones and noise floor is evident. In this case, integrating the PSD in the absence of the signal indicates a precision equivalent to 13.5 bits. This result indicates that, as expected, most of the pipelined ADC error visible in the PSD of FIG. 2b is caused by the DAC noise introduced by the 17-level DACs 112, 122 in the first two stages 11, 12 (shown in FIG. 1). It can be verified that most of the remaining 0.6 bits of performance degradation relative to the ideal component case arises from the interstage gain error between the first and second stages 11, 12 (shown in FIG. 1) of the pipeline.

3. Application of DNC to the Exemplary Pipelined ADC

As demonstrated by the results presented in the previous section, a significant performance improvement can be obtained by digitally removing from the pipelined ADC 1 output the error components resulting from the noise introduced by the 17-level DACs 112, 122 in the first two pipeline stages 11, 12 (shown in FIG. 1). In the simulation software used to generate FIG. 2c, this was done directly using a priori knowledge of the specific one-bit DAC errors, which would not be practical in an actual pipelined ADC. However, the DNC technique achieves almost the same effect except in a practical fashion without requiring a priori knowledge of the one-bit DAC errors. The modifications to the pipelined ADC of FIG. 1 that are necessary to apply the DNC technique to the first two pipeline stages are presented in this section 3.

Figure 3:
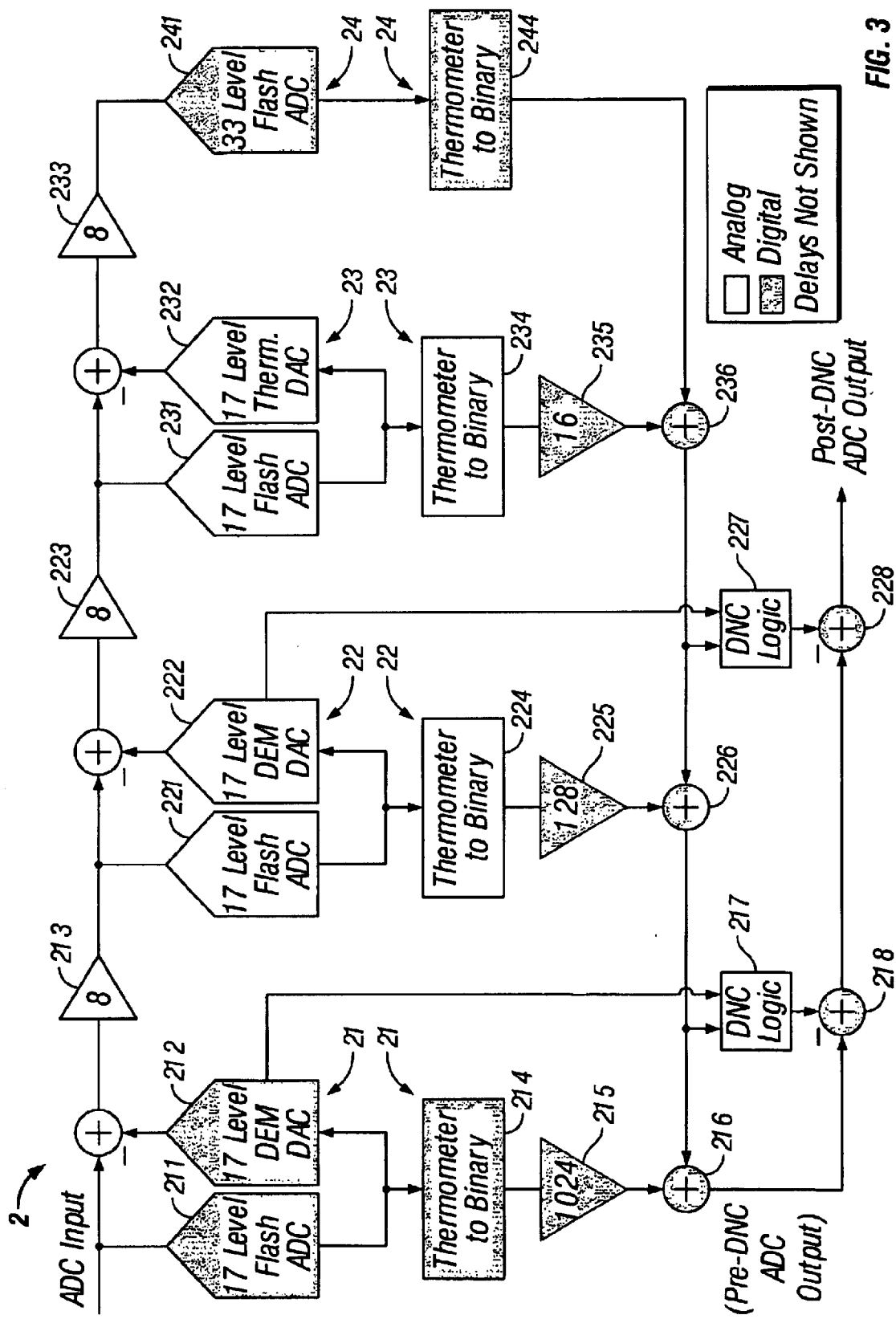
FIG. 3 is a functional diagram of the exemplary pipelined ADC previously seen in FIG. 1 now with the digital noise cancellation (DNC) of the present invention applied to its first two stages.

The modified pipelined ADC 2 with DNC applied to the first two pipeline stages 21, 22 is shown in FIG. 3. It differs from the conventional version ADC 1 (shown in FIG. 1) in two respects. First, the 17-level DACs 112, 122 (shown in FIG. 1) in the first two stages have been replaced by modified DACs referred to as dynamic element matching (DEM) DACs 212, 222. The DEM DACs 212, 222 differ from the thermometer encoded DACs 112, 122 shown in FIG. 1 and described in the previous section 2 in that each contains a digital encoder that randomly permutes the connections between the 16 thermometer encoded input bits and the 16 switched-capacitor one-bit DACs. Second, two blocks—labeled DNC logic 217, 227 in FIG. 3—have been included that each generate estimates of the error component in the ADC output arising from the noise introduced by the associated DEM DAC 212, 222. These estimated error sequences are subtracted in subtractors 218, 228 from what would otherwise be the output sequence in a conventional pipelined ADC.

As explained in detail in the next section 4, aside from gain and offset errors, the DAC noise introduced by each DEM DAC 212, 222 consists of a sum of 15 terms. Each term is the product of a constant and a unique modulation sequence. The constant depends only upon the one-bit DAC errors. The modulation sequence is restricted to the values 0, and 1, and its sign varies randomly such that it is uncorrelated with the other modulation sequences and with the pipelined ADC 2 input signal. The modulation sequences associated with each DEM DAC 212, 222 are generated explicitly by the digital encoder, and are made available to the corresponding DNC logic block 217, 227 as digital signals.

Each DNC logic block 217, 227 performs two functions: 1) it estimates the 15 constants associated with the DAC noise from the corresponding DEM DAC 212, 222, and 2)

it generates an estimate of the DAC noise by combining the 15 estimated constants and the 15 known modulation sequences. Each constant is estimated by multiplying (i) the combined digital outputs of the appropriate pipeline stages by (ii) the corresponding modulation sequence, and averaging (iii) the non-zero components of the resulting sequence. As shown in the next section, the average converges to the desired constant because the modulation sequence is uncorrelated to all but the term containing the constant.

Figure 4:
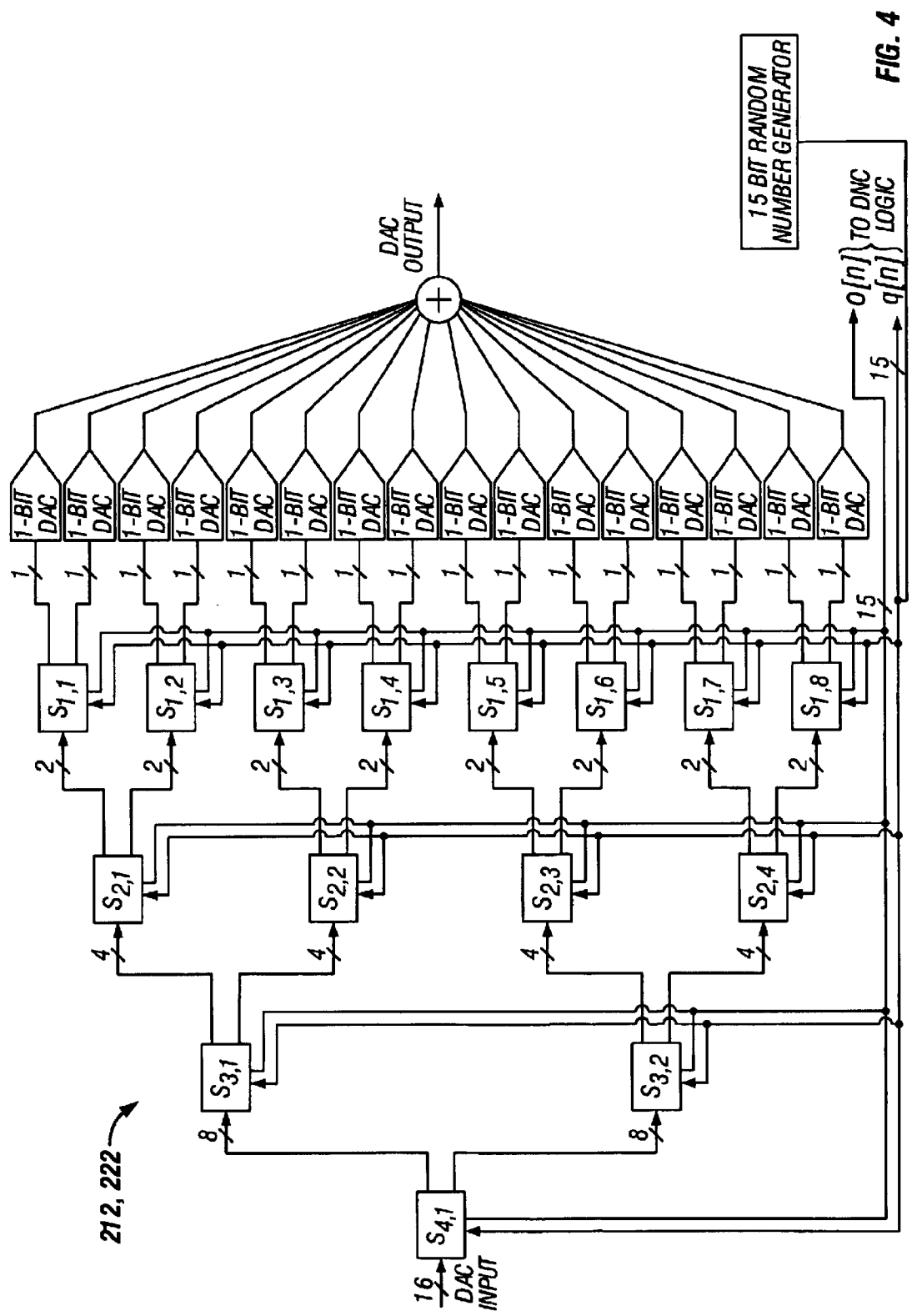
FIG. 4 is a diagram of the topology of a preferred 17-level DEM DAC used in each of the first two stages of the pipelined ADC in accordance with the present invention.
Figure 5:
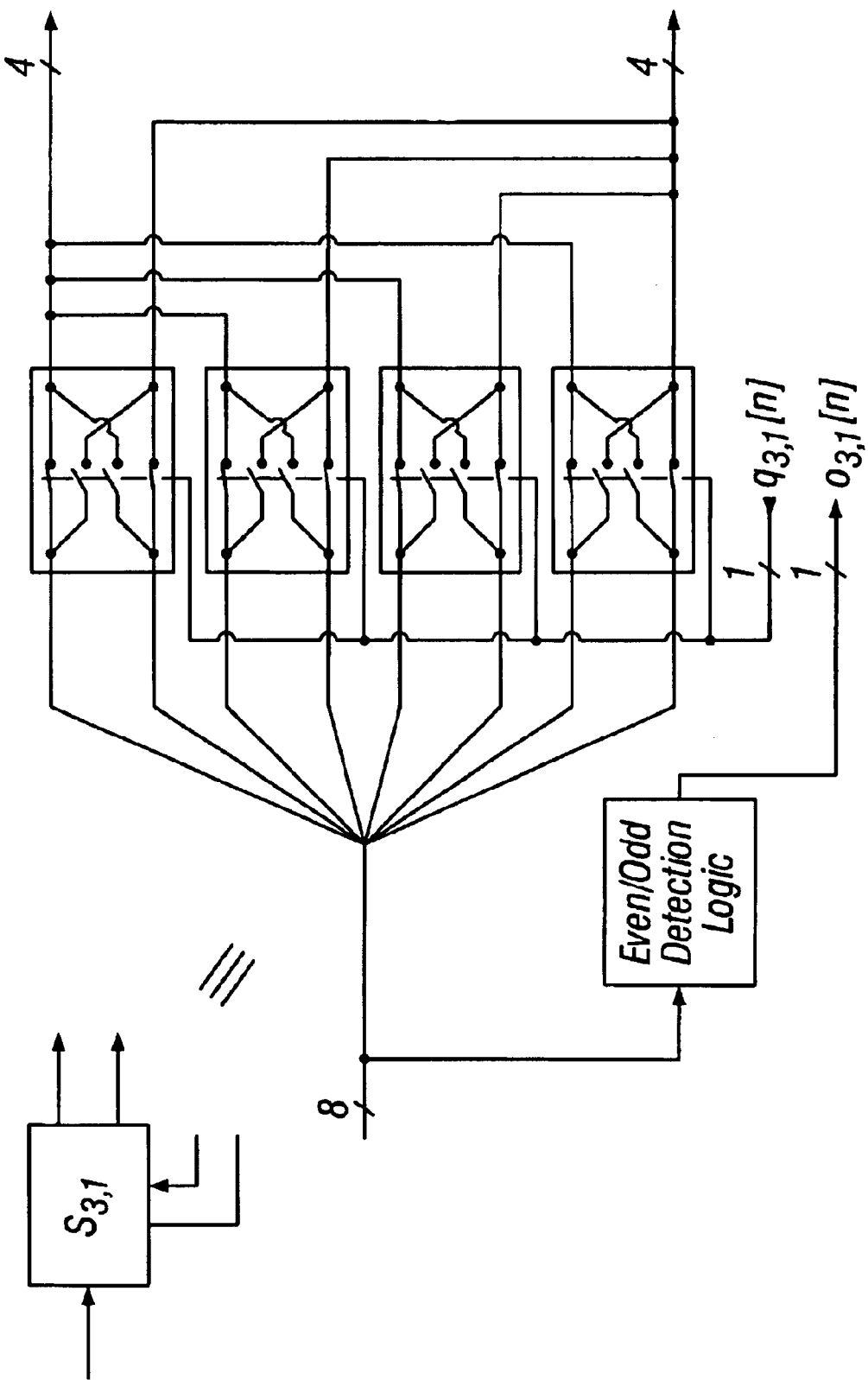
FIG. 5 is a detail diagram of the implementation of a $S_{3,1}$ switching block as an exemplary implementation of a general switching block structure used in the pipelined ADC of the present invention.

The high-level topology of each DEM DAC 212, 222 (shown in FIG. 3) is shown in FIG. 4. The digital encoder is comprised of the tree structure of 15 digital blocks labeled $S_{k,r}$ in the Figure where k=1, ..., 4 and r=1, ..., 8. These blocks are referred to as switching blocks. The implementation details of the $S_{3,1}$ switching block are shown in FIG. 5 as an example of the general switching block architecture. As indicated in FIG. 5, each pair of input bits is passed through a swapper cell that either passes the bits straight through to the output or interchanges their order depending upon whether the random control bit, $q_{3,1}$, is high or low. See L. R. Carley and J. Kenney, "A 16-bit 4'th order noise-shaping D/A converter," IEEE Proc. CICC, pp. 21.7.1–21.7.4, 1988. See also L. R. Carley, "A noise shaping coder topology for 15+ bits converters," IEEE Journal 23 Oct. 20, 1999 23 of Solid-State Circuits, vol. SC-24, pp. 267–273, April 1989. See finally T. W. Kwan, R. W. Adams and R. Libert, "A stereo multibit Sigma Delta DAC with asynchronous master-clock interface", IEEE Journal of Solid State Circuits, vol. 31, no. 12, pp. 1881–1887, Dec. 1996.

All the swapper cells in a given switching block share the same random control bit, so the effect of each switching block is to pass all the even numbered input bits to the top output and all the odd numbered input bits to the bottom output, or vice versa, depending upon whether the random control bit is high or low. Each switching block, $S_{k,r}$, contains logic that sets the parity bit, $o_{k,r}$, high if there are an odd number of input bits to the switching block that are high, and sets it low otherwise. The 15 parity bits and 15 random control bits associated with each DEM DAC 212, 222 are used by the DNC logic 217, 227 in estimating the error arising from the DAC noise, as will be described shortly.

The switching blocks are all-digital devices, so they can be implemented using digital logic gates. However, in high-speed pipelined ADCs, the resulting propagation delay through the DAC may be unacceptably large. In such cases, a better approach is to use transmission gates for the switches in the swapper cells. Each transmission gate can be implemented using a pair of MOS transistors as shown in FIG. 6, consisting of FIGS. 6a through 6c. Transmission gates, sometimes called transfer gates, are fast, but offer no gain. Accordingly, in implementing digital logic circuit functions with transmission gates care must be taken that an input signal is not so weak, nor a transmission path through transmission gates so long, that a circuit output signal should prove to be indeterminate.

The benefit of using transmission gates over conventional logic gates for the swapper cell switches is that they can be configured (i.e., each switch can be turned off or on) at a point in each clock cycle prior to the time at which the data is available from the flash ADCs. In this case conventional gate delays are avoided, and the delay through the digital encoder is determined mainly by the RC time constants resulting from the on-resistance and stray capacitances associated with each switch. Conventional digital combinational logic can be used to implement the even/odd detection logic in each switching block because propagation delay is not an issue for the parity bits.

As indicated in FIG. 3, the DNC logic block 217 associated with the first stage 21 has two input buses: one from the DEM DAC 212 in the first stage, and one from the combined digital outputs of the three stages 22, 23, 24 following the first stage 21. The data bus from the DEM DAC 12 consists of the 15 random bits, $\{q_{k,r}[n]\}$, and the 15 parity bits, $\{o_{k,r}[n]\}$, described above. The other bus represents a value referred to as the "digitized residue" of the first stage 21.

Similarly, the DNC logic block 227 associated with the second stage 22 has as its inputs a bus consisting of the 15 random bits and 15 parity bits from the DEM DAC 222 in the second stage, and a bus representing the digitized residue of the second stage 22. It can be verified from the details of FIG. 3 that the bus representing the digitized residue of the first stage 21 is 12 bits wide, and that representing the digitized residue of the second stage 22 is 9 bits wide.

Figure 7:
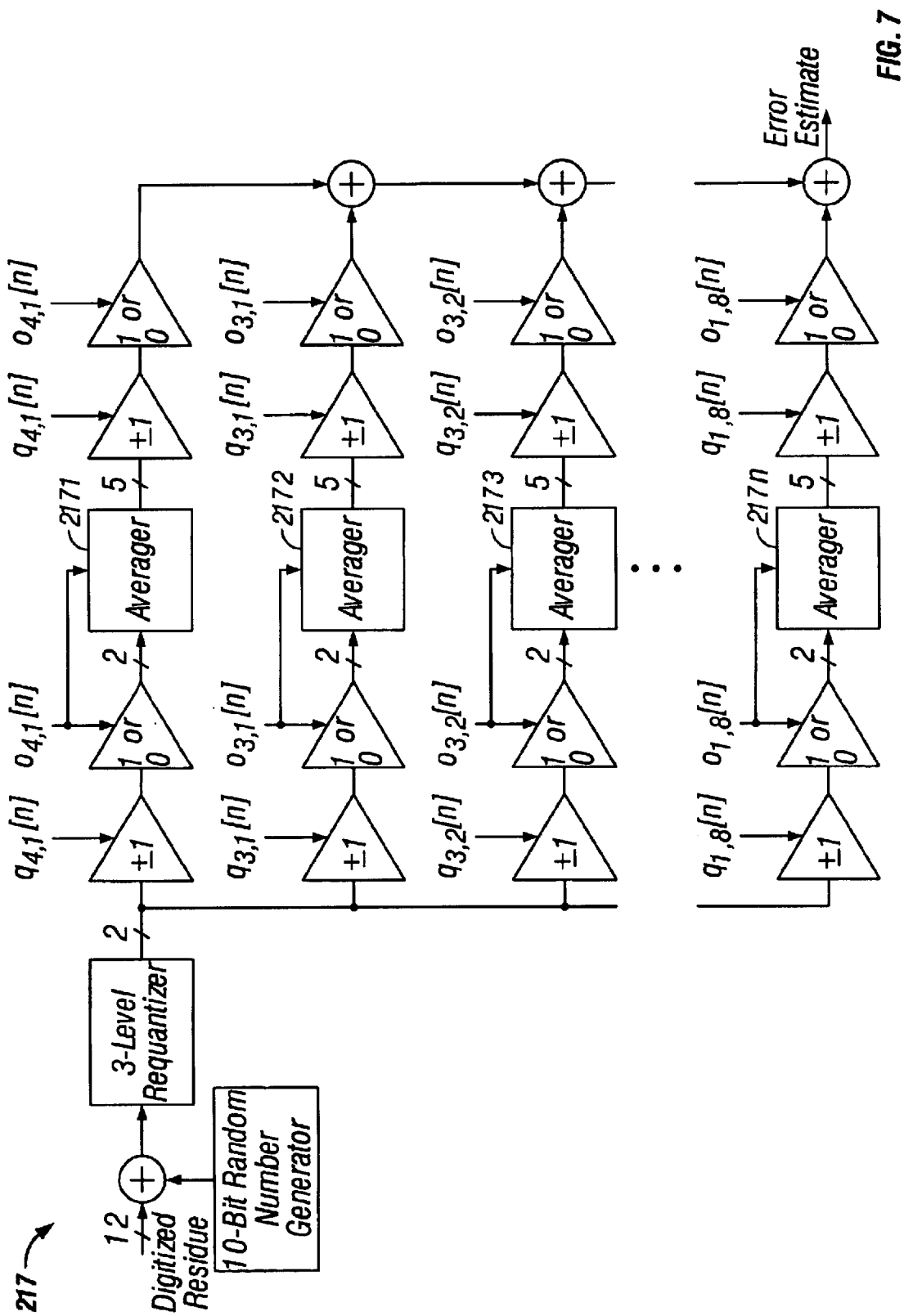
FIG. 7 is a detail diagram of the implementation of the DNC logic for the first pipeline stage of the ADC of the present invention; each of the 15 "channels" corresponds to one of the switching blocks of the DEM DAC.
Figure 8:
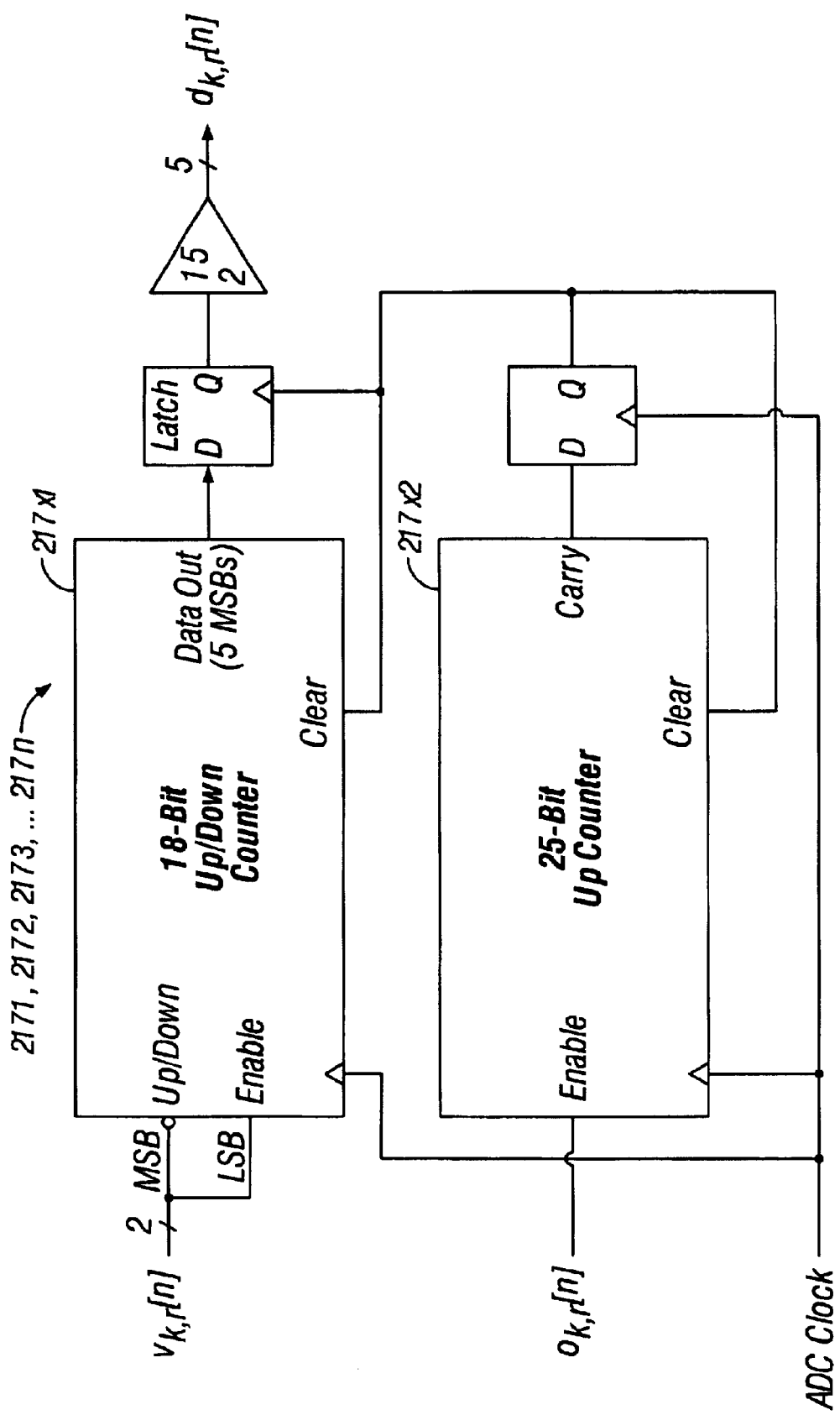
FIG. 8 is a detail diagram of the implementation of the DNC averager for the first pipeline stage.

The details of the DNC logic block 217 associated with the first stage 21 of the pipelined ADC 2 (all shown in FIG. 3) are shown in FIGS. 7 and 8. As indicated in FIG. 7, a 10-bit random number is added to the digitized residue, and the result is requantized to a three-level sequence according to $$q[n] = \begin{cases} 1 & \text{if } s[n] \geq 512 \\ -1 & \text{is } s[n] < 512 \\ 0 & \text{otherwise,} \end{cases}$$

where s and q are the input and output, respectively, of the requantizer. Thus, the quantizer acts as an ideal unity-gain mid-tread quantizer followed by a scale factor of 2. The remainder of the DNC logic 217 consists of 15 parallel channels that all operate on the three level signal from the requantizer. The outputs of the channels are added together to generate the estimate of the error arising from the noise introduced by the first-stage DEM DAC 12 (shown in FIG. 3).

Each channel corresponds to one of the switching blocks in the first-stage DEM DAC 12 (shown in FIG. 3). As shown in FIG. 7, the three-level input to each channel is first effectively multiplied by 1, 0 or −1 or depending upon the states of the random bit and the parity bit from the corresponding switching block of the DEM DAC. The resulting sequence is operated on by the blocks 2171, 2172, 2173 . . . 217n labeled "averager" in FIG. 7, and the output of each averager 2171–217n is subjected to the same 1, 0 or −1 multiplication as applied to the sequence at the input to the channel. Each averager 2171–217n samples its input sequence each time the parity bit, $o_{k,r}[n]$, is high, and adds the value to that of an internal accumulator. Each time $2^{25}$ such samples have been accumulated, an averager 2171–217n updates its output register with the accumulated value divided by $2^{15}$ (i.e., right-shifted by 15 bit positions) and truncated to 5 most significant bits (MSBs). It then clears the accumulator and begins the accumulation process again; the output register is not updated again until the next $2^{25}$ samples have been accumulated. The $2^{-10}$ scale factor imposed by the requantizer in combination with the $2^{-15}$ scale factor imposed by the averager results in a combined scale factor of $2^{-25}$. Thus, a true average of each set of $2^{25}$ data samples is ultimately performed by each channel.

A hardware-efficient implementation of each averager 2171–217n shown in FIG. 7 is shown in FIG. 8. The three-level input sequence, labeled $v_{k,r}[n]$ in FIG. 8, is interpreted as a two's complement value. The 18-bit up/down counter 217×1 performs the accumulation, and the 25-bit up-counter 217×2 determines when each complete set of $2^{25}$ samples has been accumulated.

The above discussion, and the details of FIGS. 7 and 8 apply to the DNC logic 217 associated with the first stage 21 of the pipelined ADC 2 (all shown in FIG. 3). The DNC logic 227 associated with the second stage 22 of the pipelined ADC 2 is identical except that most of the bus and register widths are smaller. Specifically, the digitized residue bus width is 9 bits, the random number bus width is 7-bits, the up-down counter width is 15 bits, and the up-counter width is 20 bits.

Figure 9A:
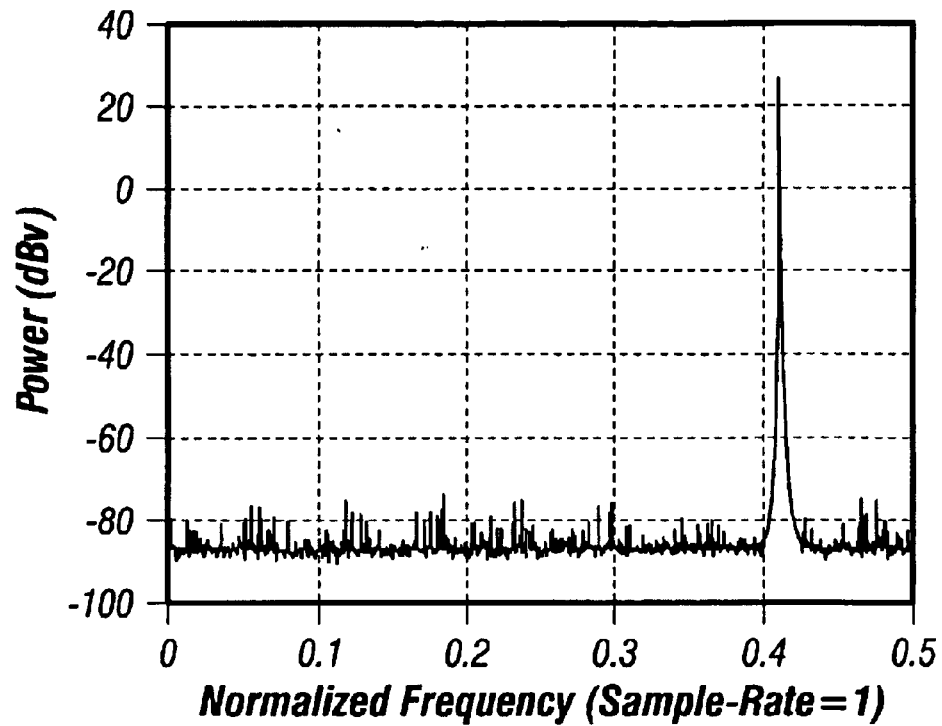
FIG. 9, consisting of FIGS. 9a through 9c, are graphs of the power spectral density of the output of the pipelined ADC of the present invention as implemented a) with the DNC technique of the present invention applied to the first two stages of the pipeline, b) without any DNC, and c) with ideal post-ADC removal of the error components arising from the DAC noise introduced in the first two stages of the pipeline.
Figure 9B:
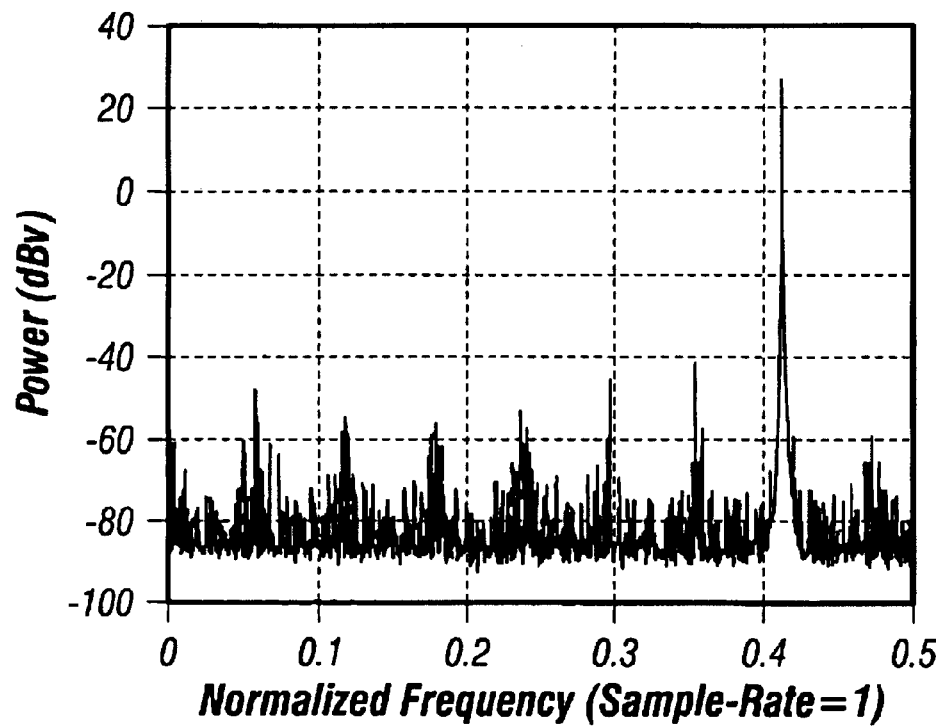
Figure 9C:
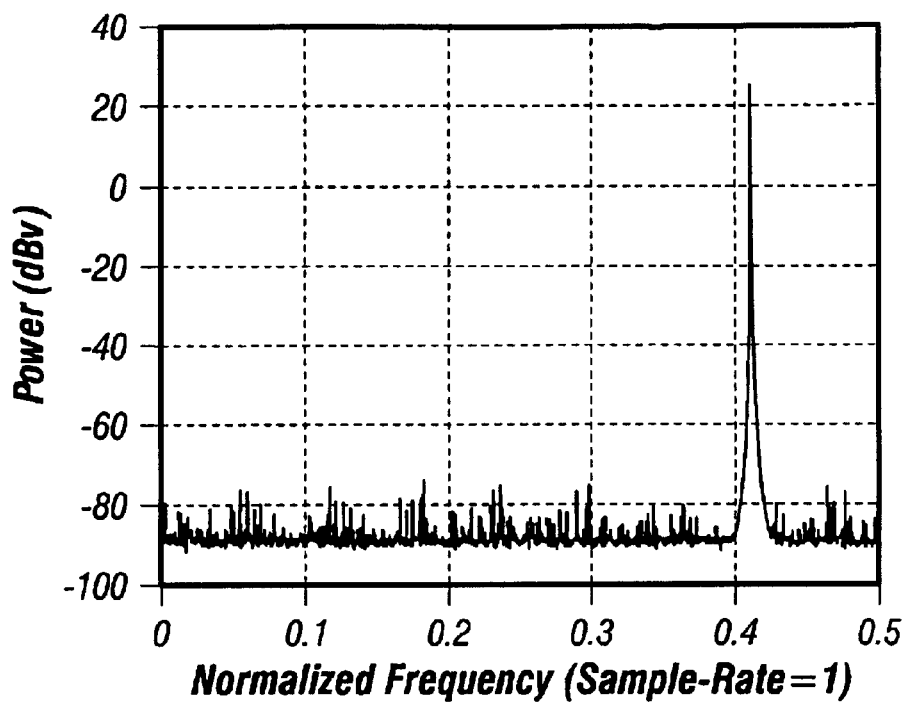

FIG. 9a shows a PSD plot of the output of the pipelined ADC 2 having DNC in accordance with the present invention, as was depicted in FIGS. 3–8. The simulated circuit errors and input signal were the same as those used to obtain the results shown in FIG. 2. For comparison purposes, FIGS. 2b and 2c should be compared with FIGS. 9b and 9c, respectively; FIG. 9b shows results corresponding to FIG. 9a except without DNC, and FIG. 9c shows the effect of ideally removing the error components associated with the DAC noise introduced in the first two pipelined stages 21, 22 of the ADC 2. The A/D conversion precision associated with the results of FIG. 9a is 13.3 bits whereas those of FIGS. 9b and 9c are 10.4 bits and 13.5 bits, respectively.

Thus, the DNC technique of the present invention resulted in an overall improvement of 2.9 bits relative to the case without DNC. The 13.5 bits of A/D conversion precision achieved by ideally removing the error sequences arising from DAC noise introduced in the first two pipeline stages represents the limit of the performance improvement that could be achieved by the DNC technique for the input signal and circuit errors simulated. As explained in the next section, allowing the averagers 2171–217n (shown in FIG. 7) for the DNC logic 217, and the equivalent averagers for the DNC logic 227 (both DNC logic 217, 227 shown in FIG. 3) to average a larger number of samples causes the A/D conversion precision of the ADC 2 (shown in FIG. 3) with DNC to more closely approach this limit.

The simulation results shown in FIG. 9 correspond to a full-scale input sinusoid. Smaller amplitude input signals tend to result in faster convergence and smaller spurious components and this translates into a lower noise floor in the ADC output. Numerous simulations have been performed with various input signals and random errors. On average, the DNC technique implemented as described above results in a performance improvement of approximately 2.7 bits relative to the same pipelined ADC 1 without DNC.

4. Overview of the DNC Signal Processing Theory

This section 4 describes the DNC technique from a signal processing point of view in the context of the pipelined ADC 2 with DNC presented in the previous section 3. The signal processing details of the DNC technique as applied to the first and second stages 21, 22 of the pipelined ADC 2 (shown in FIG. 3) are almost identical, so only the first-stage DNC 217 (shown in FIGS. 3–5) is considered in this section.

Figure 10:
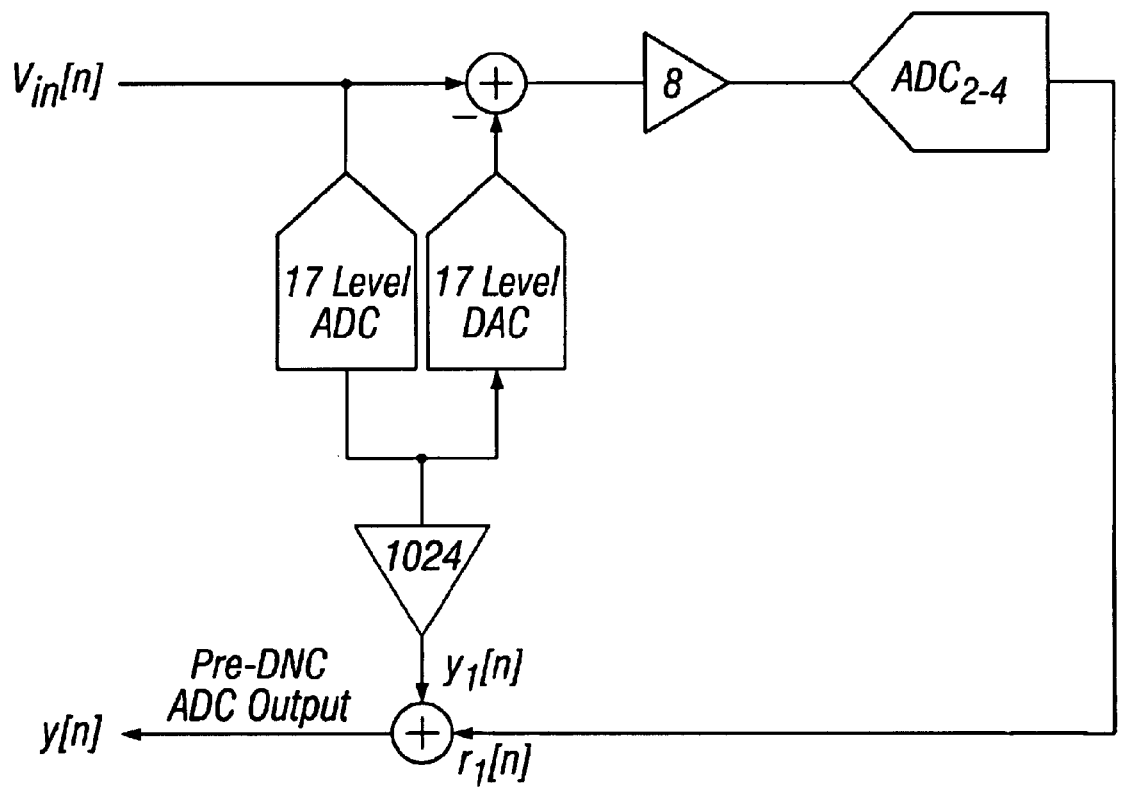
FIG. 10 is a diagram of the pipelined ADC of the present invention with its last three stages represented by a single ADC denoted as $ADC_{2-4}$.

The last three stages 22, 23, 24 of the pipelined ADC 2 digitize the analog residue from the first stage 21 of the pipelined ADC 2, and therefore they can be viewed as an ADC in their own right. This is depicted in FIG. 10 wherein the pipelined ADC is shown with the second through fourth stages 22–24 represented by an equivalent ADC, denoted as ADC 2–4. [NOTE: ADC 2 is not ADC 2–4.] As described in the previous section 3, with ideal components the overall pipelined ADC 2 has a quantization step-size of $1.6 \times 2^{-14}$ V, and a first interstage gain of 8. Therefore, the A/D conversion performed by the last three stages 21–23 of the pipeline has a nominal quantization step-size of 8 times that of the overall pipelined ADC 2, namely $1.6 \times 2^{-16}$ V. In the absence of non-ideal circuit behavior, it follows that the digitized residue of the first stage 21 and the scaled digital output of the first stage 21 can be written as:

$$r_1[n]|_{ideal} = e_{ADC_{2-4}}[n] - 2^{10} \cdot e_{ADC_1}[n] \tag{1}$$

and $$y_1[n]|_{ideal} = \frac{2^{14}}{1.6} \cdot V_{in}[n] + 2^{10} \cdot e_{ADC_1}[n]$$

respectively, where $e_{ADC_{2-4}}[n]$ is the quantization noise from the last three stages of the overall pipelined ADC 2, and $e_{ADC_1}[n]$ is the quantization noise from the 17-level ADC 211 in the first stage 21. (Recall from Section 2. that the LSB of each A/D conversion is interpreted as unity which implies that the gain of the A/D conversion process is equal to the inverse of the quantization step-size.) Therefore, in the absence of non-ideal circuit behavior, the output of the overall pipelined ADC 2 would be the sum of (1) and (2), which reduces to:

$$y[n]|_{ideal} = \frac{2^{14}}{1.6} \cdot V_{in}[n] + e_{ADC_{2-4}}[n]$$

It follows from the presentation in Section 2 that this is a 14-bit representation of the input signal, $V_{in}[n]$.

In the presence of non-ideal circuit behavior, the situation is more complicated. To quantify this statement, consider the pipelined ADC 2 with the following types of non-ideal component behavior: 1) interstage amplifier gain errors, 2) errors in the output levels of the one-bit DACs, and 3) errors in the quantization threshold levels of the flash ADCs 211, 221, 231. In switched-capacitor circuits, these errors arise largely from capacitor ratio mismatches, so it is reasonable to assume that they are nearly invariant over time.

For multi-bit DACs 212, 222, 232 consisting of several one-bit DACs, as considered in this specification, errors in the one-bit DACs give rise to a gain error and a signal-dependent DAC noise component. Thus, the analog output sequence, say $x_a[n]$, of any such DAC can be written in terms of its digital input sequence, say $x_d[n]$, as:

$$x_a[n] = \Delta_{DAC}(1 + \epsilon_{DAC}) \cdot x_d n + e_{DAC}[n] \tag{3}$$

where $\Delta_{DAC}$ is the nominal step-size of the DAC, $\epsilon_{DAC}$ is a constant DAC gain error and $e_{DAC}$ is the DAC noise. In the absence of one-bit DAC errors, $\epsilon_{DAC}$ and $e_{DAC}$ would both be zero.

Similarly, the digital output sequence, $y_d[n]$, of any ADC can be written in terms of its analog input sequence, $y_a[n]$, as:

$$y_d[n] = \frac{1}{\Delta_{ADC}}(1 + \epsilon_{ADC}) \cdot y_a n + e_{ADC}[n] \tag{4}$$

where, again, $\Delta_{ADC}$ is the nominal step-size of the ADC, $\epsilon_{DAC}$ is a constant ADC gain error, and $e_{DAC}$ is the ADC noise. In the absence of non-ideal circuit behavior, $\epsilon_{DAC}$ would be zero, and $e_{DAC}[n]$ would be uniform quantization noise. However, errors in the quantization threshold levels cause the ADC gain error to be non-zero, and cause $e_{DAC}[n]$ to represent non-uniform quantization noise.

It is straightforward to derive expressions for $r_1[n]$ and $y_1[n]$ in the system of FIG. 10 with the DAC and ADCs modeled using equations (3) and (4), respectively, and with the first interstage gain set to $8 \cdot (1+\epsilon_1)$, where $\epsilon_1$ represents the interstage gain error. With respect to the DNC logic, $r_1[n]$ is the sequence of interest because one-bit DAC errors in the first-stage DAC give rise to error in $r_1[n]$ but have no effect on $y_1[n]$. The expression for $r_1[n]$ is:

$$r_1[n] = r_1[n]|_{ideal} - \gamma \cdot e_{DAC_1}[n] + v[n] \quad (5)$$

where is a constant, $e_{DAC}[n]$ is the DAC noise introduced by the 17-level DAC in the first pipeline stage, and $v[n]$ is a function that does not depend upon $e_{DAC}[n]$. Specifically:

$$\gamma = \frac{2^{14}}{1.6} \cdot (1+\epsilon_{ADC_{2-4}}) \cdot (1+\epsilon_1)$$

where $\epsilon_{ADC2-4}$ is gain error of the A/D conversion performed by the last three pipeline stages, and $$v[n] = [2^{10} - 1.6 \cdot 2^{-4} \cdot \gamma \cdot (1+\epsilon_{DAC_1})] \cdot \epsilon_{ADC_1}[n] - \quad (6)$$
$$\gamma \cdot (\epsilon_{ADC_1} + \epsilon_{DAC_1} + \epsilon_{ADC_1}\epsilon_{DAC_1}) V_{in}[n]$$

where $\epsilon_{ADC1}$ and $\epsilon_{DAC1}$ are the gain errors of the first-stage ADC and DAC, respectively.

From equations (5) and (6) it is evident that both the DAC noise, $\epsilon_{ADC1}$ and DAC gain error, $\epsilon_{DAC1}$ arising from the one-bit DAC errors in the first-stage DAC affect the pre-DNC pipelined ADC output, y. Specifically, $r_1[n]$, and therefore y, contains a term proportional to the first-stage DAC noise, and two terms corresponding to the first-stage DAC gain error. One of the terms corresponding to the first-stage DAC gain error is a scaled version of the pipelined ADC input signal, $V_{in}[n]$, and the other term is a scaled version of the first-stage ADC error, $e_{ADC1}[n]$. The term proportional to $V_{in}[n]$ only causes a slight gain error through the pipelined ADC, so typically it is not a problem. The term proportional to $e_{ADC1}[n]$ represents error identical in structure and similar in magnitude to that caused by the first interstage gain error, $\epsilon_1$. Simulations indicate that the effect of the first-stage DAC noise is far more significant than that of the first-stage DAC gain error. For example, the first-stage DAC 11, 21 gain error was not corrected in obtaining the results shown in, respectively, FIG. 2 and FIG. 9. Therefore, the objective of the first-stage DNC logic 217 is to estimate $\gamma \cdot e_{ADC1}[n]$ so that it may be removed from the output of the pipelined ADC 2.

Figure 11:
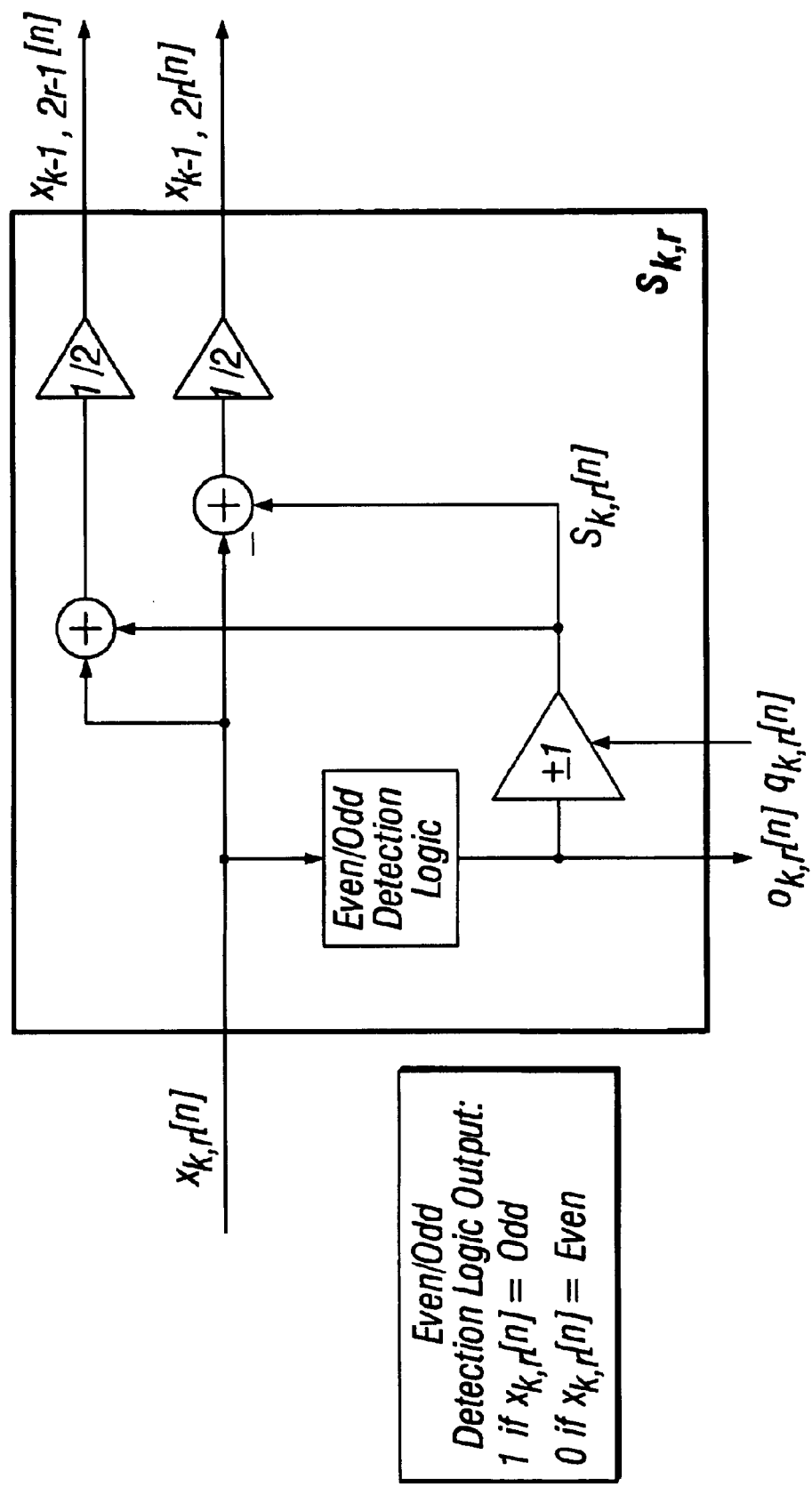
FIG. 11 is a functional diagram of the signal processing operations performed by each switching block (as shown in FIG. 5) in the ADC of the present invention.

The DEM DACs 212, 222 are designed to modulate their DAC noise sequences in a fashion that facilitates estimation by the DNC logic 217, 227 of the $\gamma \cdot e_{ADC1}[n]$ term in $r_1[n]$. Interpreting the input to each switching block of the DEM DACs 212, 222 as a thermometer encoded sequence (e.g., see FIG. 5), it is straightforward to verify that the switching block performs the signal processing operations shown in FIG. 11. Thus, the outputs of the switching block can be written as:

$$x_{k-1,2r-1}[n] = \frac{1}{2}(x_{k,r}[n] + s_{k,r}[n]) \text{ and} \quad (7)$$
$$x_{k-1,2r}[n] = \frac{1}{2}(x_{k,r}[n] + s_{k,r}[n]) \text{ where}$$

-continued
$$s_{k,r}[n] = \begin{cases} -1 & \text{if } o_{k,r}[n] = 1 \text{ and } q_{k,r}[n] = 1, \\ 1 & \text{if } o_{k,r}[n] = 1 \text{ and } q_{k,r}[n] = 0, \text{ and} \\ 0 & \text{if } o_{k,r}[n] = 0 \end{cases} \quad (8)$$

As shown in I. Galton, "Spectral shaping of circuit errors in digital-to-analog converters," IEEE Transactions on Circuits and Systems II: Analog and Digital Signal Processing, vol. 44, no. 10, pp. 808–817, Oct. 1997, the DAC noise introduced by DACs of the form shown in FIG. 4 with switching blocks that behave according to equation (7) has the form:

$$e_{DAC}[n] = \sum_{k=1}^{4} \sum_{r=1}^{2^{4-k}} \Delta_{k,r} s_{k,r}[n] + \beta \quad (9)$$

where $\Delta_{k,r}$ for k=1, ..., 4 and r=1, ..., 8 and $\beta$ depend only on the errors introduced by the one-bit DACS. If the errors in the two output levels of each one-bit DAC do not change as a function of time, as assumed in this specification, then the $\Delta_{k,r}$ and $\beta$ are all constants. The $\beta$ term in equation (9) generally is not a problem because it contributes only a constant offset to the overall pipelined ADC output, but the $\Delta_{k,r}$ constants are modulated and therefore degrade the signal-to-noise-ratio (SNR) of the pre-DNC pipelined ADC output, y[n].

Without the randomization introduced by the $q_{k,r}[n]$ sequences, the DAC noise would introduce harmonic distortion, and would thus limit the spurious-free-dynamic-range (SFDR) of the pipelined ADC. For example, with all the $q_{k,r}[n]$ sequences held low, the DEM DAC is equivalent to a thermometer encoded DAC, yet equations (8) and (9) remain valid. In this case, it follows from equation (8) that the $s_{k,r}[n]$ sequences are deterministic functions of $V_{in}[n]$. The $s_{k,r}[n]$ sequences modulate the $\Delta_{k,r}$ constants, so the DAC noise from a thermometer encoded DAC is a complicated, yet deterministic, function of $V_{in}[n]$, i.e., it represents pure harmonic distortion.

In contrast, if the $q_{k,r}[n]$ sequences well approximate independent, zero-mean, white random sequences restricted to the values 0 and 1, as tacitly assumed in Section 3 and throughout the remainder of the specification, it can be verified from equations (8) and (9) that the DAC noise is white and uncorrelated with $V_{in}[n]$. Even without DNC, an immediate benefit of this result is that the DAC noise does not contribute harmonic distortion to y[n], so the DEM DACs do not limit the SFDR of the pipelined ADC.

The randomness properties of the $q_{k,r}[n]$ sequences also facilitate the estimation by the DNC logic of the DAC noise from $r_1[n]$ and the $s_{k,r}[n]$ sequences. It follows from the $q_{k,r}[n]$ sequence properties and equation 8) that the $s_{k,r}[n]$ sequences are white, zero-mean, uncorrelated with each other and with $V_{in}[n]$, and only assume values from the set $\{-1, 0, 1\}$. Therefore, it follows from equation (9) that the DAC noise has a form similar to the sum of 15 direct-sequence spread-spectrum signals wherein each constant, $\Delta_{k,r}$, is one of the 15 "message signals" and the corresponding $s_{k,r}[n]$ is the "spreading code". Thus, from equation (5) it follows that $r_1[n]$ can be viewed as the 15 spread-spectrum signals scaled by $-\gamma$ plus uncorrelated "interference signals." The DNC logic operates in a fashion similar to a spread-spectrum receiver to estimate each $-\gamma \cdot \Delta_{k,r}$ constant and uses the estimated constants to construct an estimate of $-\gamma \cdot e_{DAC1}$ [n].

To estimate each $-\gamma \cdot \Delta_{k,r}$ constant, the DNC logic averages the product of the corresponding $s_{k,r}[n]$ sequence and the digitized residue of the first stage, $r_1[n]$, over a large number of sample times, n, for which $|s_{k,r}[n]|=1$. Such an average taken over N time samples starting from an arbitrary sample time, $n=n_0$, can be written as:

$$d_{k,r}[N] = \frac{\sum_{i=0}^{N-1} r_1[n_0+i] \cdot s_{k,r}[N_0+i]}{\sum_{i=0}^{N-1} |s_{k,r}[n_0+i]|} \quad (10)$$

For brevity in the sequel, the following shorthand notation is used for this type of averaging operation:

$$d_{k,r}[N] = \text{Average}_{s_{k,r}[n] \neq 0}(r_1[n] \cdot s_{k,r}[n])[N]$$

As described above, the $s_{k,r}[n]$ sequences are well approximated as independent, white, zero-mean sequences that are independent of $V_{in}[n]$ and are each restricted to the set of values $\{-1, 0, 1\}$. For the time being, suppose further that the average power of each $s_{k,r}[n]$ sequence is non-zero so that $$\sum_{i=0}^{N-1} |s_{k,r}[n_0+i]| \to \infty \quad (11)$$

as $N \to \infty$. These properties imply:

$$\text{Average}_{s_{k,r}[n] \neq 0}(s_{k',r'}[n] \cdot s_{k,r}[n])[N] \begin{array}{l} \to 1 \text{ if } k=k' \text{ and } r=r' \\ \to 0 \text{ otherwise} \end{array}$$

as $N \to \infty$ by virtue of the Law of Large Numbers. By similar reasoning, for any function $f[n]$ that is uncorrelated with $s_{k,r}[n]$ $$\text{Average}_{s_{k,r}[n] \neq 0}(f[n] \cdot s_{k,r}[n])[N] \to 0$$

as $N \to \infty$.

As is evident from equations (1), (5), (6), and (9), f or a given k and r the only terms in $r_1[n]$ that are not completely uncorrelated with $S_{k,r}[n]$ are $-\gamma \cdot \Delta_{k,r}$ and $e_{ADC2-4}[n]$. Since $e_{ADC2-4}[n]$ has a slight dependence on the first stage DAC noise, it is likely to have some non-zero correlation with $s_{k,r}[n]$. However, the $e_{ADC2-4}[n]$ term has a very small variance, and simulations indicate that its correlation to $s_{k,r}[n]$ is negligible compared to the 14-bit noise floor of the overall pipelined ADC. Therefore, to a very good approximation:

$$d_{k,r}[N] \to -\gamma \cdot \Delta_{k,r} \quad (12)$$

The derivation leading to equation (12) relies upon equation (11), but there exist input sequences, $V_{in}[n]$, for which equation (11) does not hold for all values of k, and r. For example, if $V_{in}[n]$ were such that the output of the first-stage ADC is always an even number, then $s_{4,1}[n]=0$ for all n; accordingly equation (11) would not hold for k=4 and r=1. However, whenever equation (11) does not hold the corresponding $s_{k,r}[n]$ term has zero average power. Therefore, the corresponding $-\gamma \Delta_{k,r}$ need not be estimated by the DNC logic, because the associated one-bit DAC errors do not contribute average power to the DAC noise.

It follows that for sufficiently large values of N, $-\gamma e_{DAC1}[n]$ is approximately equal to the sequence given by:

$$c[n] = \sum_{k=1}^{4} \sum_{r=1}^{2^{4-k}} d_{k,r} s_{k,r}[n] \quad (13)$$

Consequently, subtracting c[n] from the pre-DNC pipelined ADC output cancels most of the error arising from DAC noise introduced by the first stage DEM DAC 12 (shown in FIGS. 3–5). The accuracy with which the error is canceled depends on accuracy with which each $d_{k,r}[N]$ converges to $-\gamma \Delta_{k,r}$ whenever the corresponding $s_{k,r}[n]$ satisfies equation (11). In each case, this depends upon the number of samples, M, for which $s_{k,r}[n] \neq 0$ in the set of sample times $n_0$; $n_0+1; \ldots; n_0+N-1$. For each k and r, convergence is only required when equation (11) holds, and in these cases $M \infty$ as $N \to \infty$.

A block diagram that implements the signal processing operations described above is shown in FIG. 12. The first set of $s_{k,r}[n]$ multipliers together with the averagers calculate the $d_{k,r}[N]$ estimates, and the second set of $s_{k,r}[n]$ multipliers and the adders calculate c[n]. At the startup time, n=n', no samples of $r_1[n]$ have been averaged, so N=0, and $d_{k,r}[0]=0$. At each sample time, n>n', $d_{k,r}[N]$ is calculated using equation (10) with $n_0=n'$ and N=n-n'. Thus ideal DAC noise cancellation is achieved in the limit as $n \to \infty$.

Figure 12:
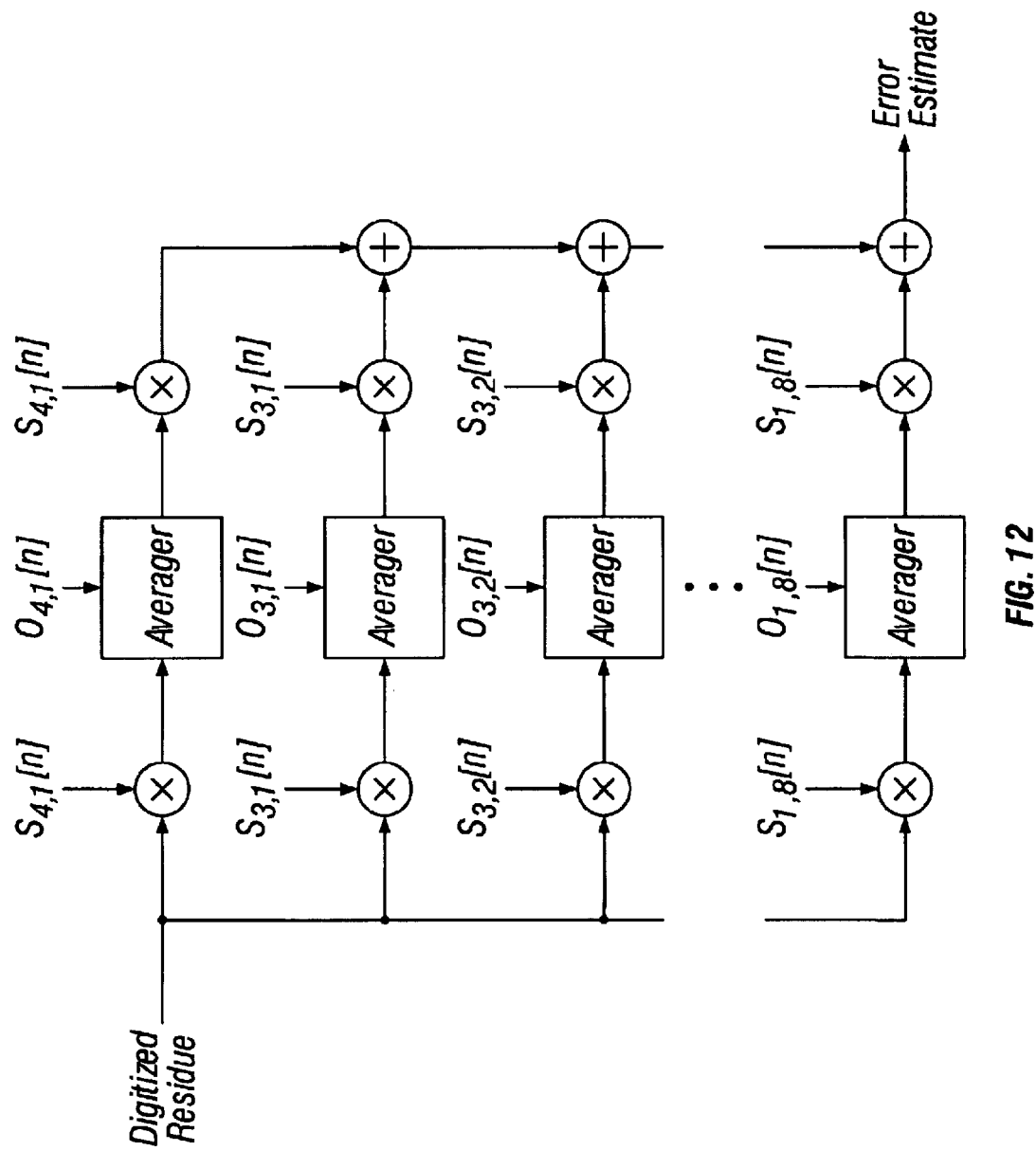
FIG. 12 is a functional diagram of the ideal signal processing operations performed by the DNC logic of the present invention.
Figure 13A:
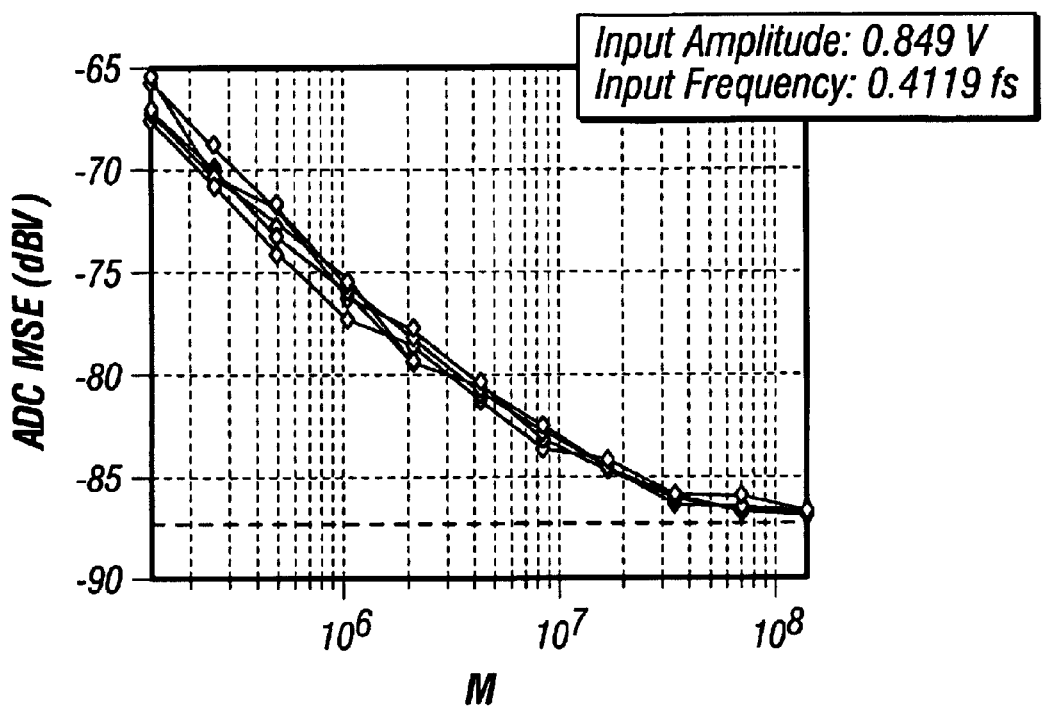
FIG. 13, consisting of FIGS. 13a through 13d, are graphs of the post-DNC pipelined ADC noise floor as a function of M for various sinusoidal $V_{in}[n]$ and various initial states of the random number generators associated with the DEM DACs and DNC logic.
Figure 13B:
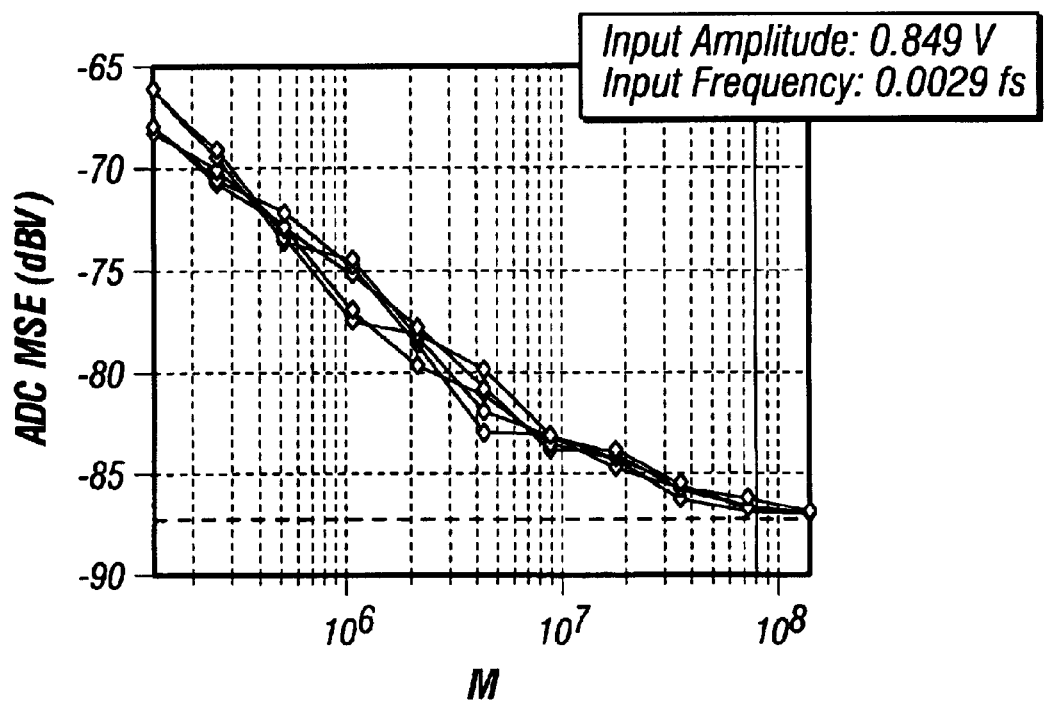
Figure 13C:
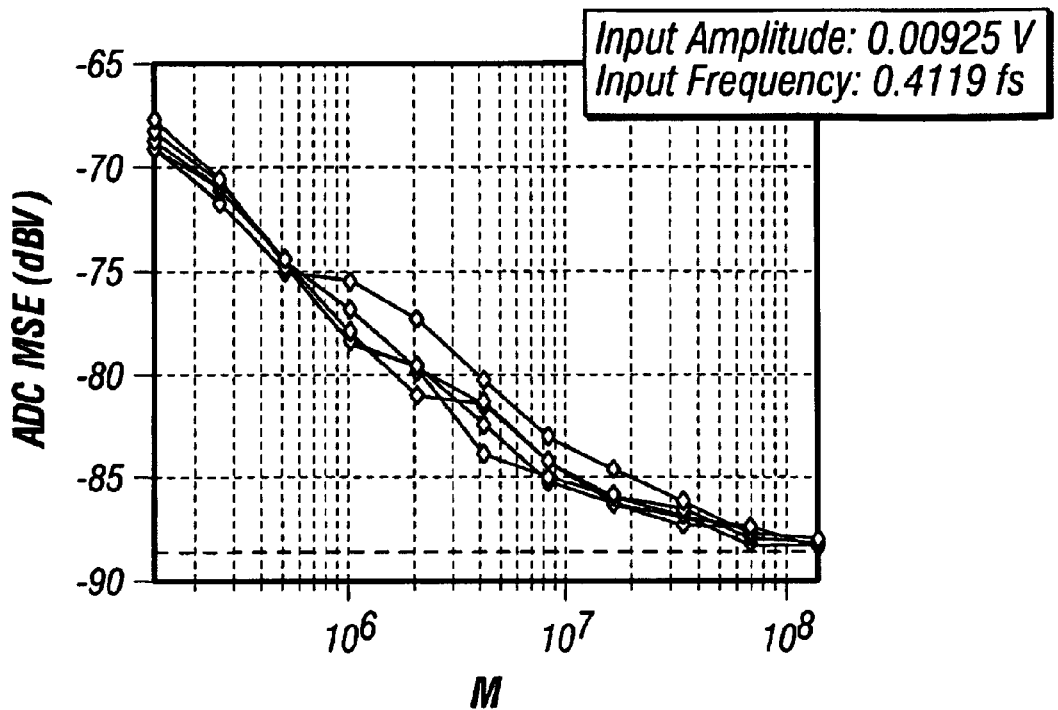
Figure 13D:
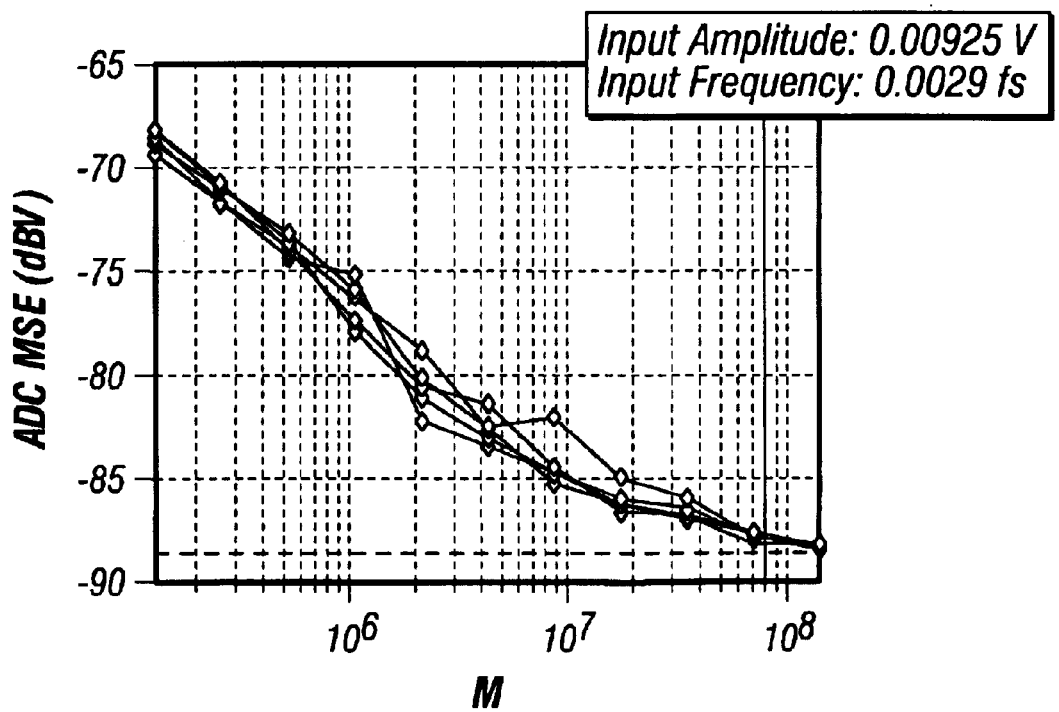

A key difference between the signal processing performed by the DNC logic 217 (and 227) described in the previous section 3 and that shown in FIG. 12 is that the DNC logic 217, 227 performs dithered requantization of the digitized residue in order to simplify the averager hardware. The 10-bit random sequence added to the digitized residue is used as a dither sequence. See A. B. Sripad and D. L. Snyder, "A necessary and sufficient condition for quantization errors to be uniform and white," IEEE Trans. Acoust. Speech Signal Processing, vol. ASSP-25, pp. 442–448, Oct. 1977. See also R. M. Gray and T. G. Stockham Jr., "Dithered quantizers," IEEE Trans. Inform. Theory, vol. 39, no. 3, pp. 805–812, May 1993.

To the extent that it well approximates a white random sequence that is uniformly distributed over its 1024 possible values and is independent of $r_1[n]$, it can be shown that the output of the three-level quantizer in the first stage DNC logic 217 is given by $r'_1[n]=r_1[n]+u[n]$; where $u[n]$ is a white random sequence that is uncorrelated with $r_1[n]$. The DNC logic 217 shown in FIGS. 3–5 and presented in Section 3 calculates each $d_{k,r}[N]$ using:

$$d_{k,r}[n] = \frac{\sum_{i=0}^{N-1} r'_1[n_0+i] \cdot s_{k,r}[n_0+i]}{\sum_{i=0}^{N-1} |s_{k,r}[n_0+i]|} \quad (14)$$

instead of equation (10). Since u[n] is uncorrelated with $r_1[n]$, and therefore with each $s_{k,r}[n]$, it follows from the arguments above that the $d_{k,r}[N]$ sequences given by equation (14) converge to the same values as those given by equation (10). However, the convergence rate is somewhat slower because the u[n] sequence gives rise to a term in equation (14) that converges to zero at a finite rate and this term is not present in equation (10).

The only other difference between the signal processing performed by the DNC logic 217 (and, equivalently, 227) described in the previous section 3 and that shown in FIG. 12 is that the DNC logic 217, 227 does not calculate the $d_{k,r}[N]$ values for ever-increasing values of N, so perfect convergence does not occur.

Instead, in every contiguous set of sample-times during which $|s_{k,r}[n]|=1$ exactly $M=2^{25}$ times, the corresponding DNC averager calculates $d_{k,r}[N]$ as given by equation (14). The output of the averager is preset to zero, and is not updated until the first M samples for which $|s_{k,r}[n]|=1$ have occurred. Once the M samples have occurred, the averager updates its output register with the calculated value of $d_{k,r}[N]$ and begins averaging the next set of input values. Thus, the actual number of samples, N, in each set over which the averager calculates $d_{k,r}[N]$ is a function of the $s_{k,r}[n]$ sequence. The reason for this design choice is that M is the value that determines the accuracy with which $d_{k,r}[N]$ approximates $-\gamma \cdot \Delta_{k,r}$ as described above.

Once the first set of $d_{k,r}[N]$ values have been calculated for all k and r, the DNC logic estimates the DAC noise to an accuracy that is independent of $V_{in}[n]$ provided the one-bit DAC errors and the interstage gain errors do not change rapidly over time. In typical applications of CMOS switched-capacitor based pipelined ADCs, it is reasonable to assume that the one-bit DAC errors and interstage gain errors do not change significantly over periods of time that are long compared to the period of the lowest signal frequency of interest. However, slow variations of these component errors may occur in response to environmental factors such as changes in temperature. To adjust to such variations, the DNC logic continuously calculates new $d_{k,r}[N]$ values during the normal operation of the pipelined ADC 2. Nevertheless, the DNC logic 217 (and, equivalently, 227) reaches its full level of accuracy once the first set of $d_{k,r}[N]$ values have been calculated for all k and r; at this point the DNC logic 217 (and, equivalently, 227) continues to operate simply to maintain this level of accuracy.

5. Convergence

Simulation of the pipelined ADC 2 (shown in FIG. 3) with the digital noise cancellation (DNC) of the present invention applied gives that post-DNC pipelined ADC noise floor (i.e., the total mean-squared error of the pipelined ADC 2 output after DAC noise cancellation) versus M for different choices of $v_{in}[n]$ which is shown in FIG. 13. The same set of one-bit DAC errors, interstage gain errors, and flash ADC errors as used in the simulations described in Sections 2 and 3 were used for all the simulations associated with FIG. 13. Each graph in FIG. 13 shows results corresponding to a sinusoidal $V_{in}[n]$ with a unique amplitude and frequency combination as labeled on the graph. The labeled values of M correspond to the first-stage DNC logic 217 and range from $2^{17}$ to $2^{27}$. In each simulation run, the value of M used in the second-stage DNC 227 logic was 32 times smaller than that of the first stage DNC logic 217. The different solid curves in each graph correspond to different initial conditions of the random number generators internal to the pipelined ADC 2; otherwise the simulations used to generate the curves were identical. The dashed line in each graph indicates the result of ideally removing from the pipelined ADC 2 output the contribution from the DAC noise sequences introduced by the first-stage and second-stage DEM DACs 212, 222. Thus, the dashed line indicates the ideal performance that could be expected from the DNC technique in the limit as $M \rightarrow \infty$.

As expected, the simulation results indicate the accuracy of the DNC technique approaches that of ideal DAC noise cancellation as M increases. The results indicate that increasing M above $2^{25}$ has a diminishing effect on the post-DNC pipelined ADC noise floor.

It follows from the theory presented in the previous section 4. that for such large values of M the post-DNC pipelined ADC noise floor is dominated by the effects of the various gain errors.

Figure 14:
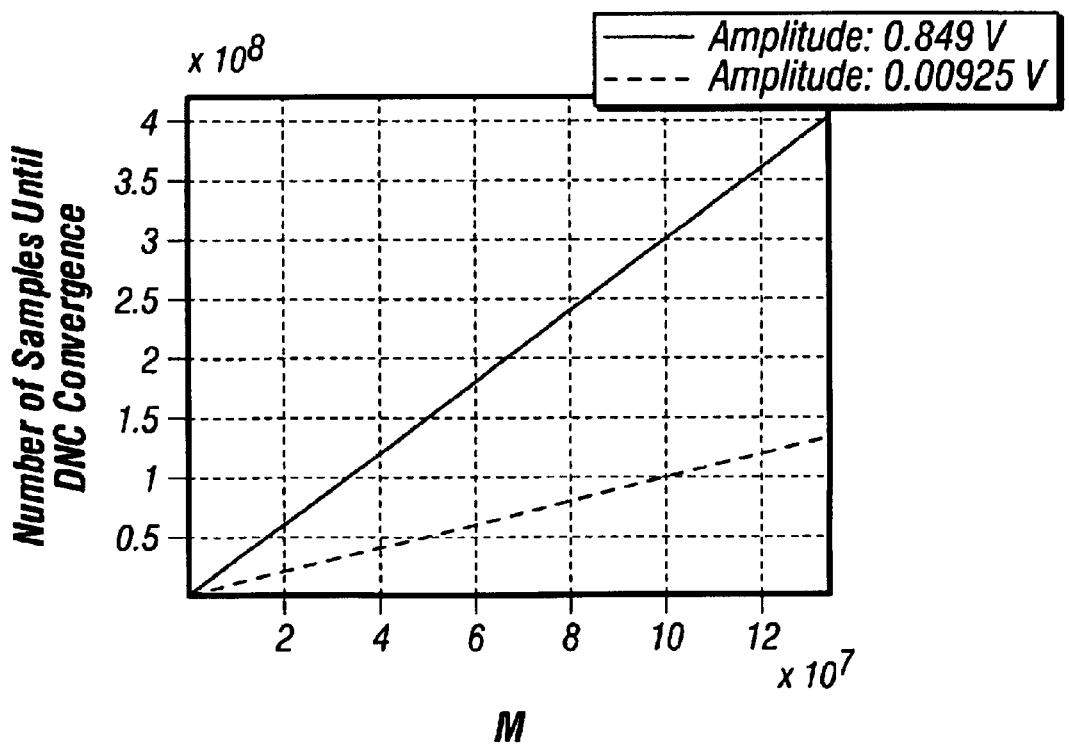
FIG. 14 is a graph showing the number of samples required to calculate all of the non-zero $d_{k,r}[N]$ values in the various states shown in FIG. 13.

FIG. 14 shows the number of time samples required to calculate the first set of non-zero $d_{k,r}[N]$ values as a function of M for all the simulation runs associated with FIG. 13. The solid line in FIG. 14 corresponds to all of the simulation runs for which $V_{in}[n]$ had an amplitude of 0.849 V, and the dashed line corresponds to all of the simulation runs for which $V_{in}[n]$ had an amplitude of 0.00925 V (the slight differences among the sets of data generated by these simulation runs are not visible given the large scale of the plot). The simulation results suggest that the number of time samples required to calculate the necessary $d_{k,r}[N]$ values increases linearly with M with a slope that depends on the amplitude of $V_{in}[n]$.

For the two sets of simulation runs in which $V_{in}[n]$ had an amplitude of 0.00925 V, the $s_{k,r}[n]$ sequences for certain values of k and r in the first-stage DAC of the pipelined ADC were always zero, so the corresponding DNC averager outputs remained fixed at zero. For these values of k and r, $V_{in}[n]$ was such that equation (11) was not satisfied, so, as described above, it is reasonable to consider the DNC logic to have fully converged once all the non-zero $d_{k,r}[n]$ values are calculated. Of course, if after this time period $V_{in}[n]$ were to change such that equation (11) should become satisfied for additional values of k and r, then the corresponding $d_{k,r}[n]$ values would be calculated by the DNC logic 217 and the total convergence would time would be greater than that indicated by the dashed line in FIG. 14.

The simulation results shown in FIGS. 13 and 14 are representative of the types of convergence behavior exhibited by the pipelined ADC 2 with DNC shown in FIG. 3 and presented in Section 3. In general, the DNC convergence is a strong function of the input amplitude and offset, and tends to be a weaker function of the how rapidly the input signal varies.

6. Conclusion

Switched-capacitor based pipelined ADCs tend to be highly sensitive to noise arising from component mismatches in their internal DACs. An all-digital technique, referred to as DNC, that continuously measures and cancels the A/D conversion error caused by such DAC noise has been presented. The details of the DNC approach have been described in the context of a particular pipelined ADC topology, although the approach is generally applicable to pipelined ADCs with multi-bit DACs. The ideal A/D conversion precision of the example pipelined ADC is 14.1 bits, but with realistic component matching and without the DNC technique, its typical simulated A/D conversion precision is 10.4 bits. With the DNC technique, its typical simulated A/D conversion precision increases to 13.3 bits. The hardware required to implement the DNC technique in the example pipelined ADC has been presented at both the signal processing level and the register-transfer-level. The associated digital hardware complexity has been shown to be modest by modern VLSI standards.

In accordance with the preceding explanation, variations and adaptations of the digital cancellation of D/A converter noise in pipelined A/D converters in accordance with the present invention will suggest themselves to a practitioner of the electrical circuit design arts.

In accordance with these and other possible variations and adaptations of the present invention, the scope of the invention should be determined in accordance with the following claims, only, and not solely in accordance with that embodiment within which the invention has been taught.

What is claimed is:

1. An improvement to a multistage pipelined Analog-to-Digital Converter (ADC), receiving an analog input signal, having a plurality of stages, connected one to the next by an interstage amplifier, each stage having a flash analog-to-digital converter (ADC), an ADC of the first stage receiving the analog input signal while ADCs of subsequent stages receive analog signals each from a respective interstage amplifier, producing a multi-level digital signal, a digital-to-analog converter (DAC) converting an associated produced multi-level digital signal to an associated intermediate analog signal, each intermediate analog signal being feed both to a subtractor of the intermediate analog signal from the associated analog signal received by the stage to produce an analog difference signal that is fed to the interstage amplifier of a next following stage, and also to a thermometer encoder producing an associated digital output signal;

wherein the digital output signals of all the plurality of stages are summed to produce an overall ADC digital output signal, the improvement wherein the digital-to-analog converter of at least one of the plurality of stages comprises:

a digital-to-analog converter (DAC) that is of a dynamic element matching (DEM) type producing, as well as an associated intermediate analog signal, a (i) plurality of random bits and a (ii) plurality of parity bits; and wherein each of the plurality of stages additionally comprises:

a Digital Noise Cancellation (DNC) logic circuit, receiving (1) the (i) plurality of random bits and the (ii) plurality of parity bits from the associated DEM-type DAC and (2) a digitized residue sum of the digital output signals of all stages beyond a stage of which the DNC logic circuit is a part, to produce an error estimate for the stage; and a subtractor of the error estimate from the DNC logic circuits of all stages beyond the first from the digital output signal of the first stage to produce a corrected ADC digital output signal.

2. The improvement to the multistage pipelined Analog-to-Digital Converter according to claim 1 applied to at least a second, as well as the first, of the plurality of stages of the multistage pipelined Analog-to-Digital Converter.

3. The improvement to the multistage pipelined Analog-to-Digital Converter according to claim 1 wherein the Digital Noise Cancellation (DNC) logic circuit for each stage comprises:

an adder of the plurality of random bits and the digitized residue to produce an intermediary result;

a three-level re-quantizer of the intermediary result producing a three-level signal;

a plurality of channels, receiving the three-level signal, each channel comprising a first multiplier multiplying the three-level signal and an associated one of the random bits, a second multiplier multiplying an output from the first multiplier and an associated one of the random bits, an averager of a predetermined number of outputs from the second multiplier producing a true average, a third multiplier multiplying the true average and the associated one of the random bits, and a fourth multiplier multiplying an output from the third multiplier and the associated one of the random bits, and an adder summing outputs of the fourth multipliers of all the channels to produce the error estimate for the stage.

4. An improvement to the multistage pipelined Analog-to-Digital Converter (ADC), receiving an analog input signal, having a plurality of stages, connected one to the next by an interstage amplifier, each stage having a flash analog-to-digital converter (ADC), an ADC of the first stage receiving the analog input signal while ADCs of subsequent stages receive analog signals each from a respective interstage amplifier, producing a multi-level digital signal, a digital-to-analog converter (DAC) converting an associated produced multi-level digital signal to an associated intermediate analog signal, each intermediate analog signal being fed both to a subtractor of the intermediate analog signal from the associated analog signal received by the stage to produce an analog difference signal that is fed to the interstage amplifier of a next following stage, and also to a thermometer encoder producing an associated digital output signal;

wherein the digital output signals of all the plurality of stages are summed to produce an overall ADC digital output signal, the improvement wherein the digital-to-analog converter of each of the plurality of stages comprises:

a digital-to-analog converter (DAC) that is of a dynamic element matching (DEM) type producing, as well as an associated intermediate analog signal, a (i) plurality of random bits and a (ii) plurality of parity bits the DEM-type DAC comprising a digital encoder dividing an N-level digital input signal into multiple digital output signals, each digital encoder comprising:

two or more switching blocks each having a digital input signal and two digital output signals;

wherein a sum of the two digital output signals equals the digital input signal; and a converter converting a sum of the multiple digital output signals as arise from all the digital encoder into a nominally equivalent analog signal; and wherein each of the plurality of stages additionally comprises:

a Digital Noise Cancellation (DNC) logic circuit, receiving (1) the (i) plurality of random bits and the (ii) plurality of parity bits from the associated DEM-type DAC and (2) a digitized residue sum of the digital output signals of all stages beyond a stage of which the DNC logic circuit is a part, to produce an error estimate for the stage; and a subtractor of the error estimate from the DNC logic circuits of all stages beyond the first from the digital output signal of the first stage to produce a corrected ADC digital output signal.

5. In a multistage analog-to-digital converter (ADC) having in each stage (i) a flash analog-to-digital converter (ADC) producing from a received analog signal a digital signal, and (ii) a thermometer encoder producing from the ADC digital signal another digital signal summable with the like digital signals of the encoders of other stages to produce a final ADC digital output signal of the multistage converter, an improvement to each stage comprising:

enhancements to the DAC of the stage so as to produce, as well as the DAC digital signal, both random bits and parity bits;

a Digital Noise Cancellation (DNC) logic circuit receiving (1) the random bits and the parity bits from the stage's enhanced ADC, and (2) the digital signal from the stages's thermometer encoder, to produce a stage error signal; and a subtractor receiving the stage error signal from the DNC logic circuit so as to error correct the ADC digital output signal and transmit it to a next stage, a succession of all stages producing in the final, ADC digital output signal of the multistage converter, an ADC digital output signal that is corrected for, inter alia, signal error rising from component mismatch in the DACs.

6. A method of correcting in a final digital output signal of a multistage analog-to-digital converter (ADC) error resultant from, inter alia, component mismatch in digital-to-analog converters (DACs) that are within each stage of the multistage ADC, the signal error correction method comprising:

producing in an enhanced DAC of each stage both (i) random bits and (ii) parity bits as well as a (iii) DAC digital signal;

producing in a Digital Noise Cancellation (DNC) logic circuit of each stage from the (i) random bits and (ii) parity bits of the stage's enhanced DAC, plus (iv) a digital signal from a thermometer encoder of the stage that has previously encoded an ADC digital signal of the stage, a stage error signal; and subtracting in a subtractor of each stage the stage's error signal produced in the DNC logic circuit from an ADC digital output signal of the stage, passing onward to a next successive stage the corrected ADC digital output signal until, at the conclusion of all stages the final ADC digital output signal is corrected for, inter alia, error in this final signal rising from component mismatch in the DACs.

7. A multistage pipelined Analog-to-Digital Converter (ADC), converting, in a plurality of stages each with an a multi-stage multi-bit digital-to-analog converter, an analog input signal into a digital output signal CHARACTERIZED IN THAT a modulation sequence is produced by the DAC of each of the plurality of stages for purpose of noise reduction in the digital-to-analog conversion; and the modulation sequences of all the DACs of all the plurality of stages are used in digital noise cancellation logic to cancel by a subtractive process such conversion noise as, nonetheless to the noise reduction in each DAC, still remains within the final digital signal output of the multistage ADC.

* * * * *